United States Patent [19]
Fujioka et al.

[11] Patent Number: 5,919,310
[45] Date of Patent: Jul. 6, 1999

[54] CONTINUOUSLY FILM-FORMING APPARATUS PROVIDED WITH IMPROVED GAS GATE MEANS

[75] Inventors: Yasushi Fujioka, Hikone; Shotaro Okabe, Nagahama; Masahiro Kanai, Hikone; Takehito Yoshino, Nagahama; Akira Sakai, Nagahama; Tadashi Hori, Nagahama, all of Japan

[73] Assignee: Canon Kabushiki Kaisha, Tokyo, Japan

[21] Appl. No.: 08/610,076

[22] Filed: Feb. 29, 1996

Related U.S. Application Data

[63] Continuation of application No. 08/070,476, Oct. 14, 1993, abandoned.

[30] Foreign Application Priority Data

| Oct. 7, 1991 | [JP] | Japan | 3-287039 |
| Oct. 24, 1991 | [JP] | Japan | 3-305254 |
| Oct. 7, 1992 | [WO] | WIPO | PCT/JP92/01301 |

[51] Int. Cl.⁶ .................................................. C23C 16/00
[52] U.S. Cl. ...................... 118/718; 118/719; 118/723 E; 118/723 MW
[58] Field of Search ...................... 118/718, 719, 118/723 E, 723 MW, 723 ME, 723 MR, 723 MA, 723 I, 723 MP, 733, 729; 156/345; 204/298.38

[56] References Cited

U.S. PATENT DOCUMENTS

| 4,438,723 | 3/1984 | Cannella et al. | 118/718 |
| 4,438,724 | 3/1984 | Doehler et al. | 118/718 X |
| 4,539,934 | 9/1985 | Fujiyama et al. | 118/723 |
| 4,545,328 | 10/1985 | Fujiyama et al. | 118/723 |
| 4,599,971 | 7/1986 | Fujiyama et al. | 118/723 |
| 4,951,602 | 8/1990 | Kanai | 118/719 |
| 4,995,341 | 2/1991 | Matsuyama | 118/718 X |
| 5,266,116 | 11/1993 | Fujioka et al. | 118/718 |
| 5,374,313 | 12/1994 | Doehler | 118/718 X |

FOREIGN PATENT DOCUMENTS

| 2-148715 | 6/1990 | Japan. |
| 3-30419 | 2/1991 | Japan. |
| 330419 | 2/1991 | Japan. |

*Primary Examiner*—R. Bruce Breneman
*Assistant Examiner*—Joni Y. Chang
*Attorney, Agent, or Firm*—Fitzpatrick, Cella, Harper & Scinto

[57] ABSTRACT

A continuous film-forming apparatus includes a plurality of reaction chambers each capable of forming a semiconductor film with a different chemical composition. The reaction chambers are arranged such that a substrate web on which a film is to be formed can be hermetically moved through each of the reaction chambers under a vacuum condition. A gas gate is disposed at a central position between each pair of adjacent reaction chambers, with each gas gate provided with a slit for communication between the adjacent reaction chambers. The slit is provided with a clearance which allows the substrate web to move therethrough, is structured such that gate gas can be introduced therein from above and beneath the substrate which is moved through the clearance, and is dimensioned such that opposite sides proximate to the position where the gate gas is introduced have different heights in accordance with the inner pressure upon film formation of each of the adjacent reaction chambers in communication with each other by the slit.

11 Claims, 17 Drawing Sheets

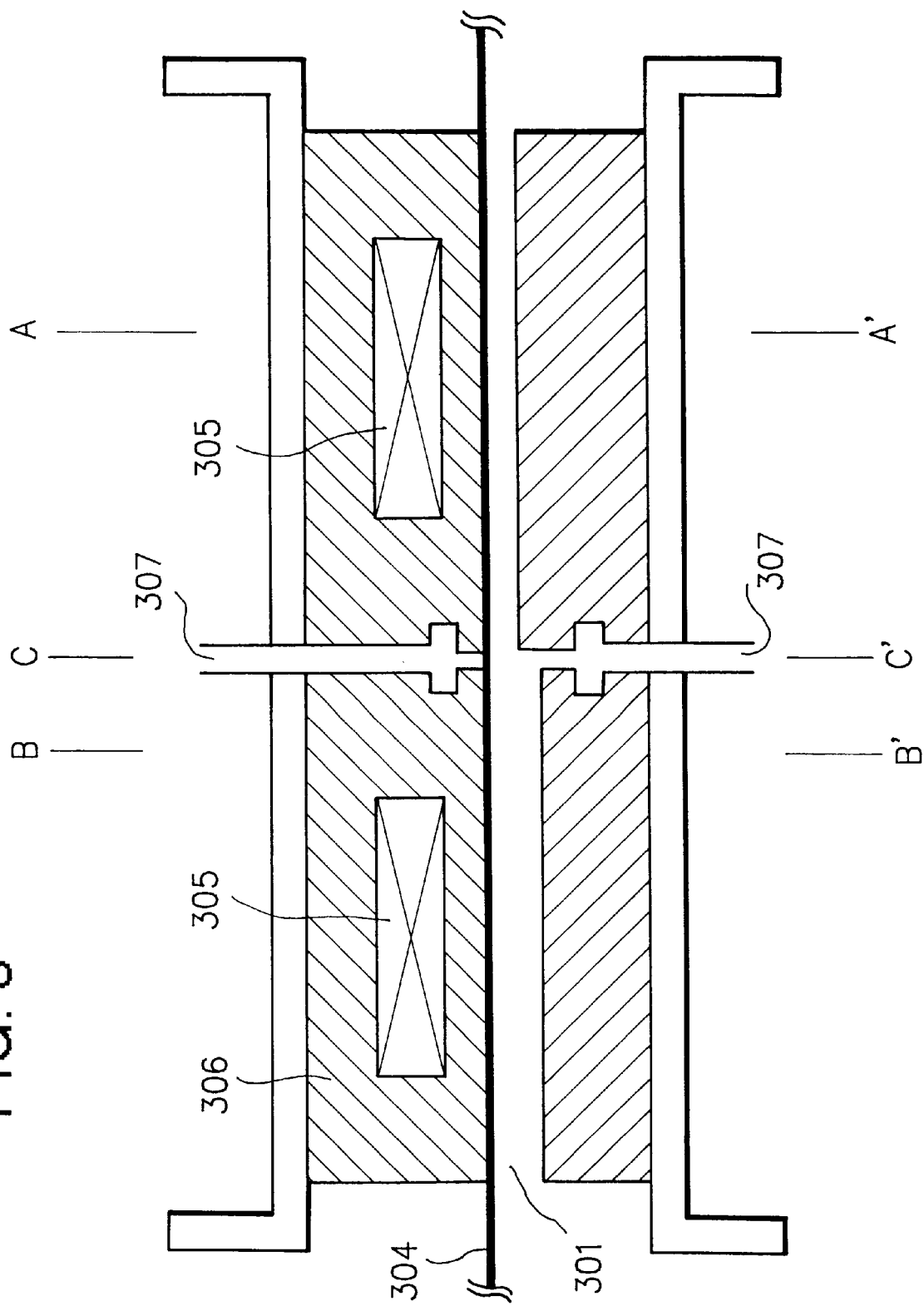

A–A' cross section

B–B' cross section

C–C' cross section

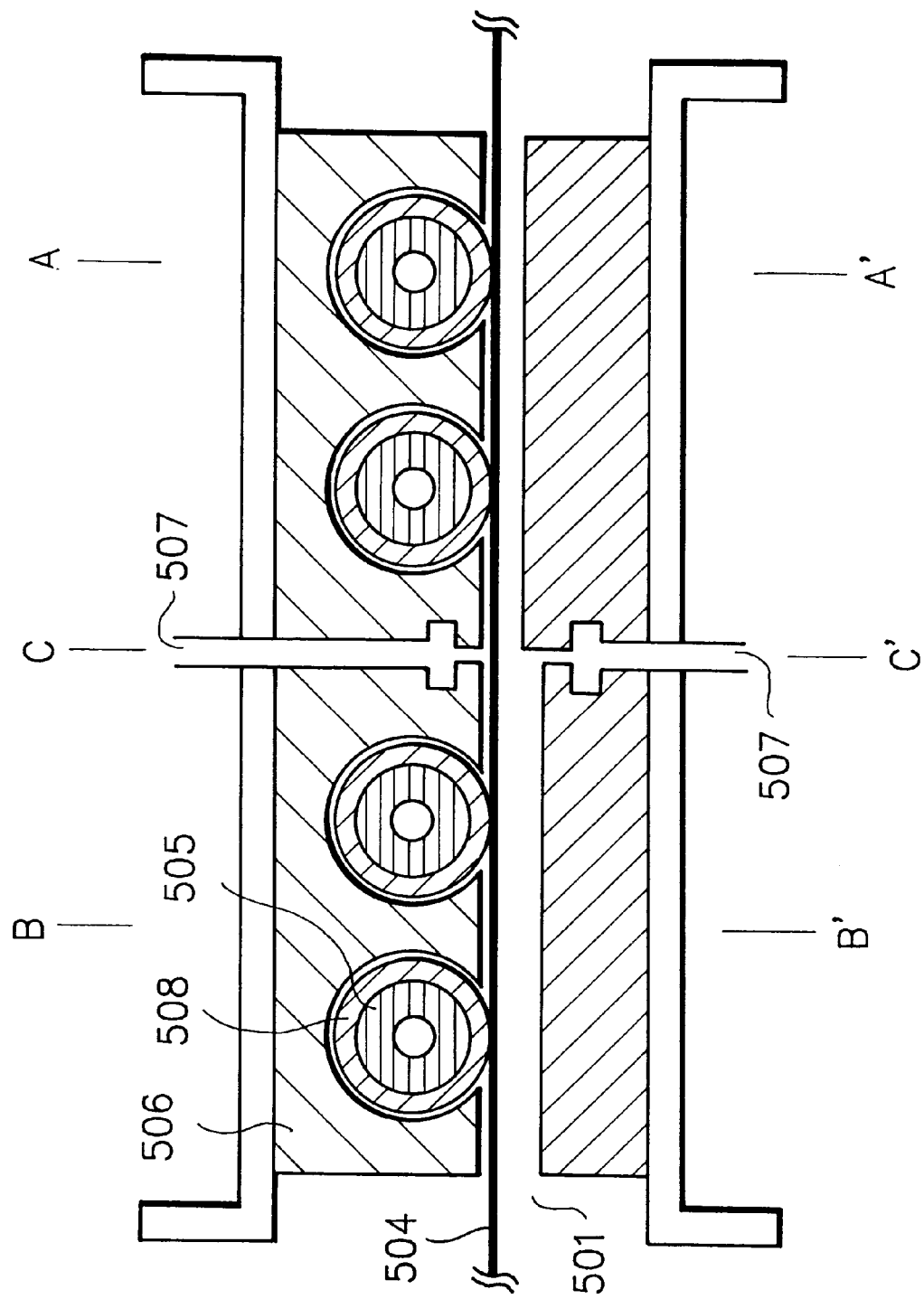

A–A' cross section

B–B' cross section

C–C' cross section

FIG. 12
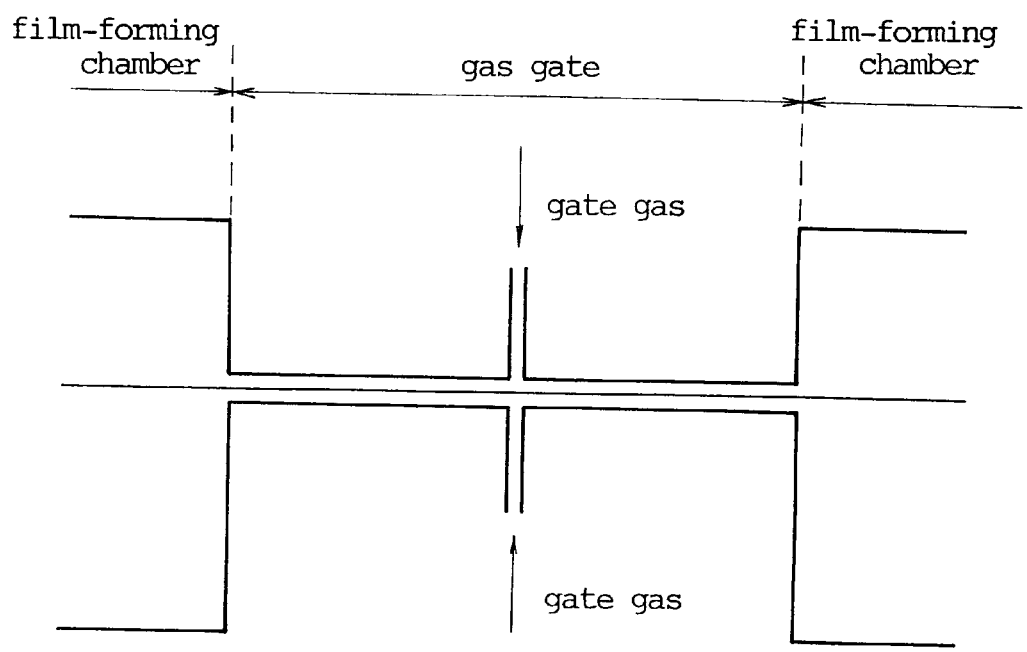
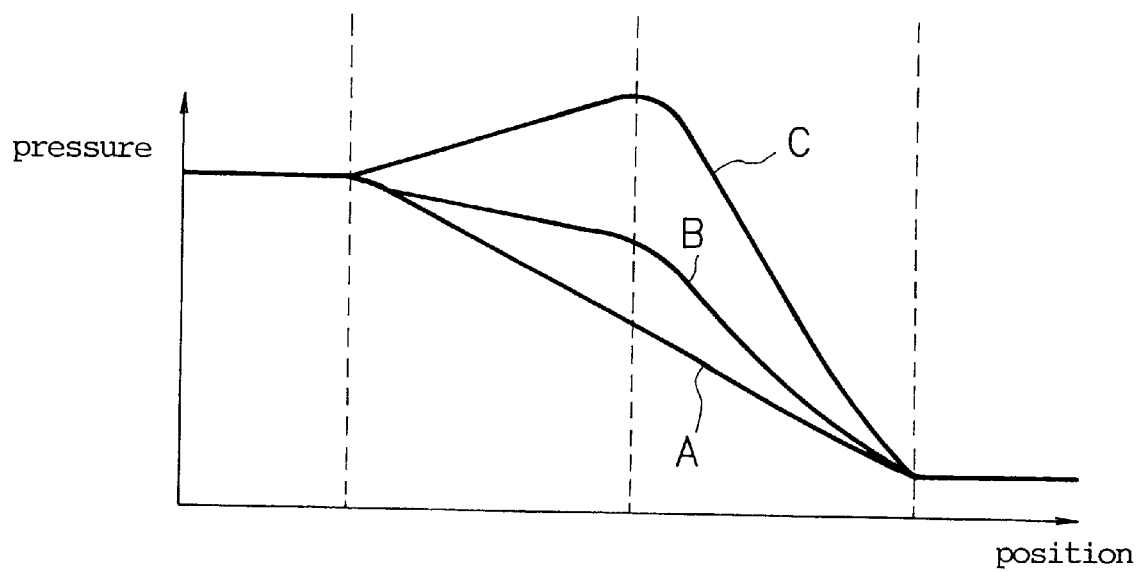

(the pressure at the position where the gate gas intoduced) − (the pressure at the opening on the high inner pressure film-forming chamber side)

CONTINUOUSLY FILM-FORMING APPARATUS PROVIDED WITH IMPROVED GAS GATE MEANS

This application is a continuation of application Ser No. 08/070,476, filed Oct. 14. 1993, now abandoned.

FIELD OF THE INVENTION

The present invention relates to a continuously film-forming apparatus suitable for continuous forming a functional deposited film on a substrate web, said apparatus comprising a plurality of reaction chambers (the reaction chamber will be hereinafter occasionally called "film-forming chamber"). The plurality of reaction chambers are communicated with each other through gas gate means which are designed such that raw material gases used in the respective reaction chambers are effectively prevented from being mixed with each other, and each of the reaction chambers are capable of efficiently forming a desirable functional deposited film on the substrate web without suffering from contamination of a foreign matter. More particularly, the present invention relates to a continuous film-forming apparatus suitable for forming, for example, a semiconductor device such as a photovoltaic device with a pin junction on a substrate web, said apparatus comprising, for example, a reaction chamber capable of forming a p-type semiconductor film by the RF plasma CVD process, a reaction chamber capable of forming an i-type semiconductor film by the microwave plasma CVD process, and a reaction chamber capable of forming an n-type semiconductor film by the RF plasma CVD process, wherein a gas gate means (A) is disposed at the central position between the p-type semiconductor film-forming reaction chamber and the i-type semiconductor film-forming reaction chamber, said gas gate means (A) being structured such that gate gas can be supplied from upward and downward directions and said gas gate means (A) being provided with a slit which is dimensioned to have a relatively large size on the side of the p-type semiconductor film-forming reaction chamber and a relatively small size on the side of the i-type semiconductor film-forming reaction chamber respectively in the direction of moving the substrate web, and a gas gate means (B) is disposed at the central position between the i-type semiconductor film-forming reaction chamber and the n-type semiconductor film-forming reaction chamber, said gas gate means (B) being structured such that gate gas can be supplied from upward and downward directions and said gas gate means (B) being provided with a slit which is dimensioned to have a relatively small size on the side of the i-type semiconductor film-forming reaction chamber and a relatively large size on the side of the n-type semiconductor film-forming reaction chamber respectively in the direction of moving the substrate web.

BACKGROUND OF THE INVENTION

There have been proposed various apparatus capable of continuously forming a desired functional deposited film on a substrate web in order to obtain a semiconductor device such as a photovoltaic device. Specifically, there are known continuously film-forming apparatus in which a substrate web supplied from a substrate storage chamber is continuously transported through a plurality of reaction chambers to another substrate storage chamber, wherein a given semiconductor film is formed in each of the reaction chambers.

An example of such film-forming apparatus is disclosed in U.S. Pat. No. 4,438,723. This apparatus is for continuously forming, for example, a p-type semiconductor layer, an i-type semiconductor layer and an n-type semiconductor layer on a substrate web, and it comprises a first reaction chamber for the formation of the p-type semiconductor layer, a second reaction chamber for the formation of the i-type semiconductor layer and a third reaction chamber for the formation of the n-type semiconductor layer, wherein an isolation means is disposed between the first reaction chamber and the second reaction chamber such that the constituent elements of the p-type semiconductor layer are prevented from contaminating into the second reaction chamber, and another isolation means is disposed between the second reaction chamber and the third reaction chamber such that the constituent elements of the n-type semiconductor layer are prevented from contaminating into the second reaction chamber, and wherein the second reaction chamber is maintained at a higher pressure than the first and third reaction chambers upon film formation. According to this continuously film-forming apparatus, it is possible to stack a plurality of semiconductor layers with a different chemical composition on the substrate web. The above patent document does not detail about these isolation means. It is, therefore, understood that each of the isolation means is dedicated simply to isolate the adjacent reaction chambers from each other and the respective adjacent reaction chambers are maintained at a predetermined different inner pressure capable of preventing mutual diffusion of the raw material gases used in the respective reaction chambers. In this case, problems are unavoidably occurred in that since each of the isolation means is provided with a passageway to communicate the adjacent reaction chambers which allows the substrate web to pass therethrough, the raw material gas in one reaction chamber maintained at a relatively high inner pressure is unavoidably allowed to flow through the passageway into the other reaction chamber maintained at a relatively low inner pressure, resulting in not only a change in the inner pressure of the latter reaction chamber but also varying the state of plasma generated in the latter reaction chamber, and because of this, it is difficult to form a desirable deposited film in the latter reaction chamber.

U.S. Pat. No. 4,462,332 discloses a continuous film-forming apparatus provided with gas gate means which is capable of eliminating these problems in the continuously film-forming apparatus described in the foregoing U.S. Pat. No. 4,438,723. This apparatus comprises a plurality of reaction chambers, i.e., a p-type semiconductor layer-forming reaction chamber, an i-type semiconductor layer-forming reaction chamber, and an n-type semiconductor layer-forming chamber, wherein a gas gate means is disposed between each adjacent reaction chambers such that it is situated in close proximity to the i-type semiconductor layer-forming reaction chamber. Each of the gas gate means serves to prevent mutual diffusion of the film-forming raw material gases used in the respective reaction chambers, and it is structured such that gate gas is introduced only from one direction and the gate gas introduced is flown toward the p-type or n-type semiconductor layer-forming reaction chamber. In this continuous film-forming apparatus, each of the gas gate means is provided with a passageway through which a substrate web travels, and a plurality of magnets are provided at the upper passageway wall, wherein the substrate web travels through the passageway while contacting with the upper passageway wall. This results in reducing the size of the passageway. According to this continuously film-forming apparatus, although the foregoing problems in the continuously film-forming apparatus described in U.S.

Pat. No. 4,438,723 can be solved to a certain extent, it is still difficult to definitely prevent mutual diffusion of the respective raw material gases used in each adjacent reaction chamber, since the related parameters including the conductance of the gas gate means and the flow rate of the gate gas used are necessary to be accurately controlled to do so. Particularly, in the case of preparing, for example, a pin junction semiconductor device, it is necessary that the p-type and n-type semiconductor layers are made relatively thin and the i-type semiconductor layer is made remarkably thick. Hence, the pin junction semiconductor device is usually prepared in a manner that each of the p-type and n-type semiconductor layers is usually formed, for example, by means of the RF plasma CVD process, and the i-type semiconductor layer is formed by means of the microwave plasma CVD process. In this case, the film deposition pressure in the i-type semiconductor layer-forming reaction chamber is made to be distinguishably lower than that in each of the p-type semiconductor layer-forming reaction chamber and the n-type semiconductor layer-forming reaction chamber, wherein it is required for the dopant-imparting raw material gas used in each of the p-type semiconductor layer-forming reaction chamber and the n-type semiconductor layer-forming reaction chamber not to be contaminated into the i-type semiconductor layer-forming reaction chamber. This requirement is hardly attained by the continuous film-forming apparatus described in U.S. Pat. No. 4,438,723.

In the latter continuous film-forming apparatus, there are adapted the two gas gate means which are disposed at the opposite sides of the i-type semiconductor layer-forming reaction chamber, and each of the gas gate means is designed such that the gate gas is flown toward the p-type semiconductor layer-forming reaction chamber or the n-type semiconductor layer-forming reaction chamber, wherein a back flow is often caused in the gate gas stream, resulting in contaminating the p-type or n-type dopant-imparting raw material gas used in the p-type semiconductor layer-forming reaction chamber or the n-type semiconductor layer-forming reaction chamber into the i-type semiconductor layer-forming reaction chamber. It is extremely difficult to eliminate this problem. Japanese Unexamined Patent Publication No. 30419/1991 proposes a manner to solve this problem in that a gas gate means is disposed at the central position between each adjacent reaction chamber and gate gas is introduced into each of the gas gate means from above and it is exhausted downward. The continuous film-forming apparatus according to this proposal comprises a reaction chamber capable of forming a p-type semiconductor layer by the RF plasma CVD process, a reaction chamber capable of forming an i-type semiconductor layer by the microwave plasma CVD process, and a reaction chamber capable of forming an n-type semiconductor layer by the RF plasma CVD process, wherein one gas gate means is disposed at the central position between the RF plasma CVD p-type semiconductor layer-forming reaction chamber and the microwave plasma CVD i-type semiconductor layer-forming reaction chamber, and the other gas gate means is disposed at the central position between the microwave plasma CVD i-type semiconductor layer-forming reaction chamber and the RF plasma CVD n-type semiconductor layer-forming reaction chamber. Said Japanese document describes that the gas gate means in the continuous film-forming apparatus are operated based on a so-called modified Paschen curve. Even in this case where the gas gate means are thus arranged in the continuous film-forming apparatus, in order to facilitate the effects of the gas gate means so as to definitely prevent mutual diffusion of the respective raw material gases used in each adjacent reaction chambers, it is required to properly reduce the conductance of the slit portion of each of the gas gate means or/and to properly increase the flow rate of the gate gas used. However, there are still remained problems in this case. Firstly, there are the following problems with regard to the conductance of the slit portion of the gas gate means. That is, the conductance of the slit portion of the gas gate means is governed by the cross-sectional shape of the slit portion in the direction of the substrate web to be moved, wherein it is decreased in proportion to the length of the slit portion while it is increased in proportion to the square of the height of the slit portion, and there is a given limit for the width of the slit portion to be narrowed. Other than these, in the case where the conductance of the slit portion is reduced to a certain extent, a problem is apt to occur in that the substrate web vibrates or/and waves upon moving it. In order to move the substrate web without contacting its film deposition face with the wall face of the slit, it is necessary to establish a clearance of about 1 mm or more between the film deposition face of the substrate web and the wall face of the slit opposite the film deposition face of the substrate web. There is, however, a limit for such clearance to be established. In order to decrease the conductance of the slit portion, there is considered a manner of elongating the slit portion. However, there is known a fact that the conductance of the slit is decreased in proportion to the length of the slit. Thus, the slit is necessary to be greatly elongated, and this results in enlarging the scale of the slit. Therefore, such manner is not acceptable in practice. Secondly, there are the following problems with regard to the flow rate of the gate gas used. That is, there is a tendency that the amount of the gate gas flown into the respective reaction chambers is increased as the flow rate of the gate gas is heightened, wherein the film-forming conditions, i.e., the inner pressure, the dilution ratio of the raw material gas, the state of plasma generated, and the like in each reaction chamber are varied, and as a result, there cannot be formed a desirable deposited film in the reaction chamber. In order to prevent occurrence of these problems, there is considered a manner of raising the exhausting efficiency of a vacuuming device used. However, the vacuuming device is necessary to be of a large size to do so. Thus, the continuous film-forming apparatus described in the above Japanese document still has problems to be solved.

SUMMARY OF THE INVENTION

The principal object of the present invention is to eliminate the foregoing problems in the conventional continuous film-forming apparatus for continuously forming a functional deposited film on a web substrate and to provide an improved continuous film-forming apparatus capable of continuously forming a high quality functional deposited film on a web substrate which exhibits excellent characteristics and is usable as a constituent element of semiconductor devices such as photovoltaic devices.

Another object of the present invention is to provide a continuous film-forming apparatus comprising a plurality of reaction chambers each capable of forming a semiconductor film with a different chemical composition (for instance, a p-type semiconductor-forming reaction chamber, an i-type semiconductor-forming reaction chamber, and an n-type semiconductor-forming reaction chamber), said plurality of reaction chambers being arranged such that a substrate web on which a film is to be formed can be hermetically moved through each of the reaction chambers under vacuum condition, wherein a gas gate means is disposed at the central position between each pair of the adjacent reaction chambers, each of the gas gate means is provided with a slit for communicating the adjacent reaction chambers with each other, said slit is provided with a clearance which allows the substrate web to move therethrough. The slit is structured such that gate gas can be introduced into the gas gate means from above and below sides of said substrate web which is moved through said clearance, and said slit is dimensioned such that the both sides opposite the position through which said gate gas is introduced have a different size in accordance with the inner pressure upon film formation of each of the opposite reaction chambers communicated with each other by said slit.

A further object of the present invention is to provide a continuous film-forming apparatus suitable for continuously forming a semiconductor device such as a pin junction photovoltaic element on a substrate web while moving said substrate web, said apparatus comprising a reaction chamber capable of forming a p-type semiconductor by the RF plasma CVD process, a reaction chamber capable of forming an i-type semiconductor by the microwave plasma CVD process, and a reaction chamber capable of forming an n-type semiconductor by the RF plasma CVD process, wherein a gas gate means (A) is disposed at the central position between said p-type semiconductor-forming RF plasma CVD reaction chamber and said i-type semiconductor-forming microwave plasma CVD reaction chamber. The gas gate means (A) is structured such that gate gas can be introduced thereinto from above and below sides of said web substrate to be moved, and said gas gate means (A) is provided with a slit dimensioned to have a relatively larger size on the side of said p-type semiconductor-forming RF plasma CVD reaction chamber and a relatively smaller size on the side of the i-type semiconductor-forming microwave plasma CVD reaction chamber respectively in the direction of said substrate web to be moved. In addition a gas gate means (B) is disposed at the central position between said i-type semiconductor-forming microwave plasma CVD reaction chamber and said n-type semiconductor-forming RF plasma CVD reaction chamber. The gas gate means (B) is structured such that gate gas can be introduced thereinto from above and below sides of said substrate web to be moved, and said gas gate means (B) is provided with a slit dimensioned to have a relatively smaller size on the side of said i-type semiconductor-forming microwave plasma CVD reaction chamber and a relatively larger size on the side of said n-type semiconductor-forming RF plasma CVD reaction chamber respectively in the direction of said substrate web to be moved.

A further object of the present invention is to provide an improved gas gate means which can to easily connect each pair of the adjacent film-forming chambers, which operate at different inner pressures upon film formation, such that raw material gases used in the respective film-forming chambers are effectively prevented from being mutually diffused or contaminated to thereby establish a continuous film-forming apparatus of a so-called roll-to-roll system.

The present inventors made studies through experiments in order to eliminate the foregoing problems in the conventional continuous film-forming apparatus and in order to attain the above objects. As a result, the present inventors obtained a finding that the foregoing problems in the prior art can be eliminated and the above objects can be effectively attained in the case where a plurality of reaction chambers each capable of forming a semiconductor film with a different chemical composition (for instance, a p-type semiconductor-forming reaction chamber, an i-type semiconductor-forming reaction chamber, and an n-type semiconductor-forming reaction chamber) are arranged such that a substrate web on which a film is to be formed can be hermetically moved through each of the reaction chambers under vacuum condition; a gas gate means is disposed at the central position between each pair of the adjacent reaction chambers; each of the gas gate means is provided with a slit capable of communicating the adjacent reaction chambers with each other; the slit is provided with a clearance which allows the substrate web to move therethrough and is structured such that gate gas can be introduced into the gas gate means from above and below sides of the substrate web which is moved through the clearance; and the slit is dimensioned such that the both sides opposite the position through which the gate gas is introduced have a different size in accordance with the inner pressure upon film formation of each of the opposite reaction chambers which are communicated with each other by the slit.

The principal constitution of the continuous film-forming apparatus provided according to the present invention is as will be described below.

That is, the continuous film-forming apparatus according to the present invention comprises a plurality of reaction chambers each capable of forming a deposited film with a different chemical composition, said plurality of reaction chambers being arranged such that a substrate web on which a film is to be formed can be hermetically moved through each of the reaction chambers under vacuum condition, characterized in that a gas gate means is disposed at the central position between each pair of the adjacent reaction chambers, each of the gas gate means is provided with a slit for communicating each pair of the adjacent reaction chambers with each other. The slit is provided with a clearance which allows the substrate web to move therethrough and is structured such that gate gas can be introduced into the gas gate means from above and below sides of the substrate web which is moved through the clearance, and the slit is dimensioned such that the both sides opposite the position through which the gate gas is introduced have a different size in accordance with the inner pressure upon film formation of each of the opposite reaction chambers which are communicated with each other by the slit.

The slit in the continuous film-forming apparatus according to the present invention may have at its inner wall a means which enables the substrate web to smoothly move through the clearance without suffering from negative influences.

The continuously film-forming apparatus provided with the specific gas gate means according to the present invention provides such significant advantages as will be described in the following. That is, mutual diffusion of the respective raw material gases used in the adjacent reaction chambers can be effectively and efficiently prevented with the use of a relatively small amount of the gate gas at the slit portion. By this, the foregoing problems in the conventional continuous film-forming apparatus can be solved. Particularly, the gas gate means in the present invention has the slit having a slit portion dimensioned to have a relatively smaller size situated on the side of a reaction chamber which operates at a low pressure upon film formation and another slit portion dimensioned to have a relatively larger size situated on the side another reaction chamber which operates at a high inner pressure upon film formation. Because of this, the conductance in the gas gate means can be always maintained at a relatively low degree on the side of the low pressure film deposition reaction chamber and at a relatively high degree on the side of the high pressure film deposition reaction chamber. Hence, mutual diffusion of the respective raw material gases used in the adjacent reaction chambers can be effectively and smoothly prevented with the use of a small amount of the gate gas. And the operation parameters of the gas gate means can be easily controlled even in the case where changes occur in the film-forming conditions in each of the adjacent reaction chambers.

BRIEF DESCRIPTION OF THE DRAWINGS

FIG. 3 is a schematic view illustrating an example of the structure of a gas gate used in the apparatus according to the present invention.

FIG. 5 is a schematic view illustrating another example of the structure of a gas gate used in the apparatus according to the present invention.

FIG. 12, is a schematic view illustrating gas pressure distributions in a gas gate in the case where a distinct difference is present between the two inner pressures upon film formation of the adjacent film-forming chambers which are communicated with each other by the gas gate.

DESCRIPTION OF THE PREFERRED EMBODIMENTS

In the following, description will be made of the experiments conducted by the present inventors.

EXPERIMENTS

The present inventors provide a continuous film-forming apparatus comprising a plurality of reaction chambers each capable of forming a semiconductor film with a different chemical composition, said plurality of reaction chambers being arranged such that a substrate web on which a film is to be formed can be hermetically moved through each of the reaction chambers under vacuum condition, wherein a gas gate means is disposed at the central position between each pair of the adjacent reaction chambers, each of the gas gate means is provided with a slit which communicates the opposite reaction chambers with each other, the slit is provided with a clearance which allows the substrate web to move therethrough and is structured such that gate gas can be introduced into the gas gate means, and experimentally studied the gas gate means with respect to its performance of separating the respective film-forming raw material gases used in the adjacent reaction chambers in the continuous film-forming apparatus through the following experiments A to D.

Particularly, there were provided a plurality of gas gates each having a slit of a different height varied in the lengthwise direction of the substrate web. The gas separation performance of each these gas gates was examined while comparing with that of the conventional gas gate having a slit of a constant height.

The term "height of the slit of the gas gate" herein means a length of the slit-like shaped gas separation passageway in the thicknesswise direction of the substrate web in terms of an effective height of the gas passageway which is obtained by reducing the thickness of the substrate web from the distance between the opposite inner wall faces of the gas gate in the thicknesswise direction of the substrate web.

Figure 9:
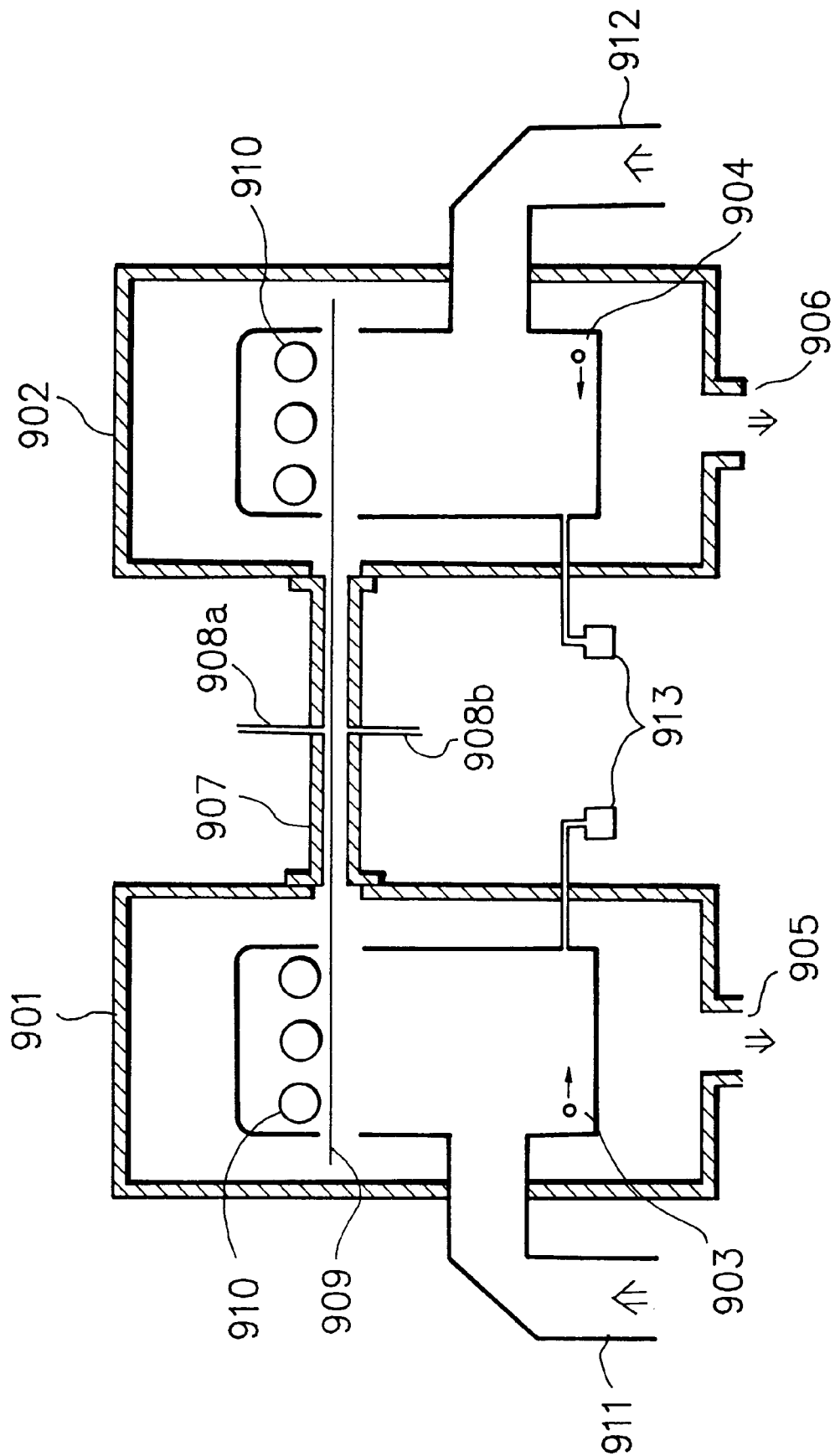
FIG. 9 is a schematic view illustrating an experimental apparatus used for the evaluation of a performance of a gas gate used in the apparatus according to the present invention and a conventional gas gate.

FIG. 9 is a schematic view illustrating the constitution of an apparatus used for examining the gas separation performance of the gas gate in each of the experiments. In FIG. 9, reference numeral 901 indicates a first reaction chamber, and reference numeral 902 indicates a second reaction chamber. Film-forming raw material gas is introduced into each of the first and second reaction chambers through a gas feed pipe 904 or 904, and the film-forming raw material gas is exhausted through an exhaust pipe 905 or 906. The first and second reaction chambers 901 and 902 are communicated with each other through a gas gate 907. The gas gate 907 is provided with opposite gate gas supply pipes 908a and 908b, through each of which gate gas supply pipes gate gas is introduced into the gas gate. Each of the reaction chambers 901 and 902 is provided with a heater 910 which serves to heat a substrate web through the rear face thereof, and a waveguide 911 or 912 which serves to supply a microwave power to provide energy to the film-forming raw material gas whereby causing discharge resulting in forming a functional deposited film on the substrate web. Reference numeral 913 indicates a pressure gage which serves to measure the inner pressure of each of the reaction chambers.

In the following experiments, there were used, as the gas gate 907, a conventional gas gate of the configuration schematically shown in FIG. 10, and four gas gates according to the present invention which are schematically shown in FIGS. 3, 16, 17, and 18, respectively. Studies were conducted of each case.

In the following experiments, each of the gas gates shown in FIGS. 3, 16, 17, 18, and 10 was used as the gas gate 907 of the apparatus shown in FIG. 9. The formation of a deposited film on the substrate web in each case was conducted in the following manner. That is, as the substrate web 909, there was used a lengthy SUS 430 web member of 30 cm in width and 0.2 mm in thickness. This substrate web was delivered from the reaction chamber 901 side and it was extended from the reaction chamber 901 via the gas gate 907 to the reaction chamber 902. Then, each of the reaction chambers 901 and 902 was sufficiently evacuated through each of the exhaust pipes 905 and 906. Thereafter, raw material gas for the formation of an i-type amorphous silicon film was introduced into the reaction chamber 901 through the gas feed pipe 903 while continuing the exhaustion. At the same time, raw material gas for the formation of a p-type amorphous silicon film was introduced into the reaction chamber 902 through the gas feed pipe 904. The inner pressure of each of the reaction chambers 901 and 902 was adjusted to and maintained at a predetermined value by controlling the volume of the gas exhausted while reading the pressure gage 913. $H_2$ gas as the gate gas was fed into the slit of the gas gate 907 through the opposite gate gas feed pipes 908. Then, a microwave power was applied into each of the reaction chamber 901 and 902, wherein glow discharge was occurred in each of the reaction chambers. By this, an i-type amorphous silicon film was formed on the substrate web in the reaction chamber 901, and simultaneously with this, a p-type amorphous silicon film was formed on the substrate web in the reaction chamber 902. The film-forming conditions in each of the two reaction chambers are shown in Table 1.

As for the i-type amorphous silicon film formed in the reaction chamber 901, the situation of an impurity distributed was examined by means of a secondary ion mass spectrometer (SIMS). And the amount of B atoms from $BF_3$ (which was used in the formation of the p-type amorphous silicon film in the reaction chamber 902) contaminated into the reaction chamber 901 was examined based on a value of B-molecular density/Si-molecular density as for the film formed therein. By this, the gas separation performance of the gas gate 907 was evaluated.

Incidentally, each of the foregoing gas gates as the gas gate 907 in the experimental apparatus used in the following experiments is provided with a gate gas feed pipe 307 which serves to supply gate gas into the gas gate, and it is also provided with magnets 305 at the slit wall situated opposite the non-deposition face of the substrate web in order to make it possible to move the substrate web while maintaining the deposition face thereof in a stable state without being damaged.

Experiment A

In this experiment, as for three gas gates A, B and C which will be described below, a difference in their gas separation performance was observed.

These three gas gates were those described in the following.

Figure 10:
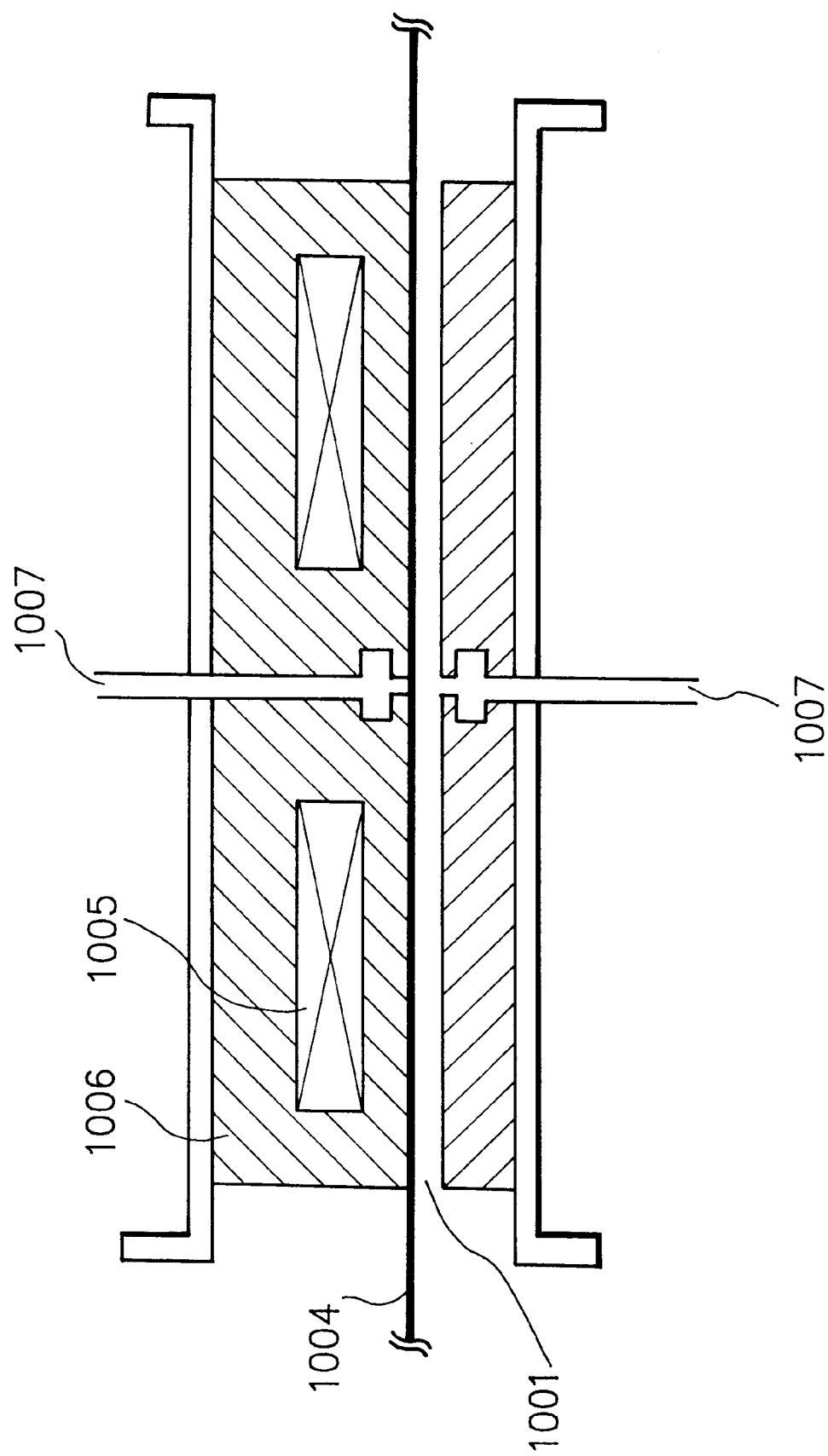
FIG. 10 is a schematic view illustrating the structure of a conventional gate gas.

A conventional gas gate (C): a gas gate (C) of the configuration shown in FIG. 10 with a slit height being constant in the direction of the substrate web 304 to be moved.

A gas gate (A): a gas gate of the configuration shown in FIG. 3 which has opposite gate gas feed pipes 307 each serving to feed gate gas into the gas gate and is provided with magnets 305 enabling the substrate web to move in a stable state without the deposition face thereof being damaged and which has a slit with a varied slit height in which the slit portion situated between the position of the gate gas feed pipe and the i-type amorphous silicon film-forming reaction chamber 901 is relatively narrowed and the slit portion situated between the position of the gate gas feed pipe and the p-type amorphous silicon film-forming reaction chamber 902 is relatively widened.

A gas gate (B): a gas gate of the configuration shown in FIG. 3 which has opposite gate gas feed pipes 307 each serving to feed gate gas into the gas gate and is provided with magnets 305 enabling the substrate web to move in a stable state without the deposition face thereof being damaged and which has a slit with a varied slit height in which a slit portion situated between the position of the gate gas feed pipe and the p-type amorphous silicon film-forming reaction chamber 902 is relatively narrowed and another slit portion situated between the position of the gate gas feed pipe and the i-type amorphous silicon film-forming reaction chamber 901 is relatively widened.

The gas gates A, B and C each having opposite gate gas feed pipes were made equivalent in terms of sizes as for the constituents except for varying their slit height, in which the size of the slit in the lengthwise direction of the substrate web is 40 cm, the size of the slit in the crosswise direction of the substrate web is 30.5 cm, the position for the gate gas to be fed is positioned at the center of the slit zone of the gas gate in the lengthwise direction of the substrate web.

Using each of the film-forming apparatus respectively having the gas gate A, B or C installed therein, experiments were conducted while providing a difference between the inner pressure upon film formation for the reaction chamber 901 and the inner pressure upon film formation for the reaction chamber 902. Particularly, there were employed such a film-forming condition that the inner pressure of the i-type amorphous silicon film-forming reaction chamber 901 is made higher than that of the p-type amorphous silicon film-forming reaction chamber 902, and such a film-forming condition that the inner pressure of the i-type amorphous silicon film-forming reaction chamber 901 is made lower than that of the p-type amorphous silicon film-forming reaction chamber 902. And in each case, $H_2$ gas was used as the gate gas, and the flow rate thereof was made to be 200 sccm and 500 sccm. The results obtained in each case are as shown in Tables 2 and 3.

Observation based on the results obtained in this experiment A

From the results shown in Tables 2 and 3, the present inventors found the following facts which had not been known in the past.

(i) The gas gate (A) in which the slit is of a relatively narrowed slit height (3.0 mm) on the side of the i-type amorphous silicon film-forming reaction chamber 901 and of a relatively widened slit height (6.0 mm) on the side of the p-type amorphous silicon film-forming reaction chamber 902 is apparently surpassing the conventional gas gate (C) in which the slit is of a substantially constant slit height (3.0 mm) in the lengthwise and the crosswise directions of the substrate web. Particularly in this respect, the film-forming raw material gases used in the p-type amorphous silicon film-forming reaction chamber 902 are substantially not contaminated into the i-type amorphous silicon film-forming reaction chamber 901 or if these gases should be contaminated, their amount is of a practically negligible extent in the former, but in the latter, the gases used in the p-type amorphous silicon film-forming reaction chamber are remarkably contaminated into the i-type amorphous silicon film-forming reaction chamber.

(ii) In the case where the inner pressure upon film formation for the i-type amorphous silicon film-forming reaction chamber 901 is higher than that for the p-type amorphous silicon film-forming reaction chamber 902, there is not found a substantial difference in the gas separation performance among the cases of using the gas gates A, B and C. However, in the case where the inner pressure upon film formation for the p-type amorphous silicon film-forming reaction chamber 902 is higher than that for the i-type amorphous silicon film-forming reaction chamber 901, the gas separation performance is distinctly different depending upon which gas gate is used. Particularly, the gas separation performance of the gas gate A is markedly higher than that of any of the gas gates B and C.

(iii) The gas separation performance of the gas gate A in which the slit height is relatively narrowed on the side of the i-type amorphous silicon film-forming reaction chamber 901 is surpassing that in the case wherein the slit height of the gas gate is partially narrowed, particularly, the gas separation performance of the gas gate B in which the slit height is relatively narrowed on the side of the p-type amorphous silicon film-forming reaction chamber 902.

Experiment B

Figure 16:
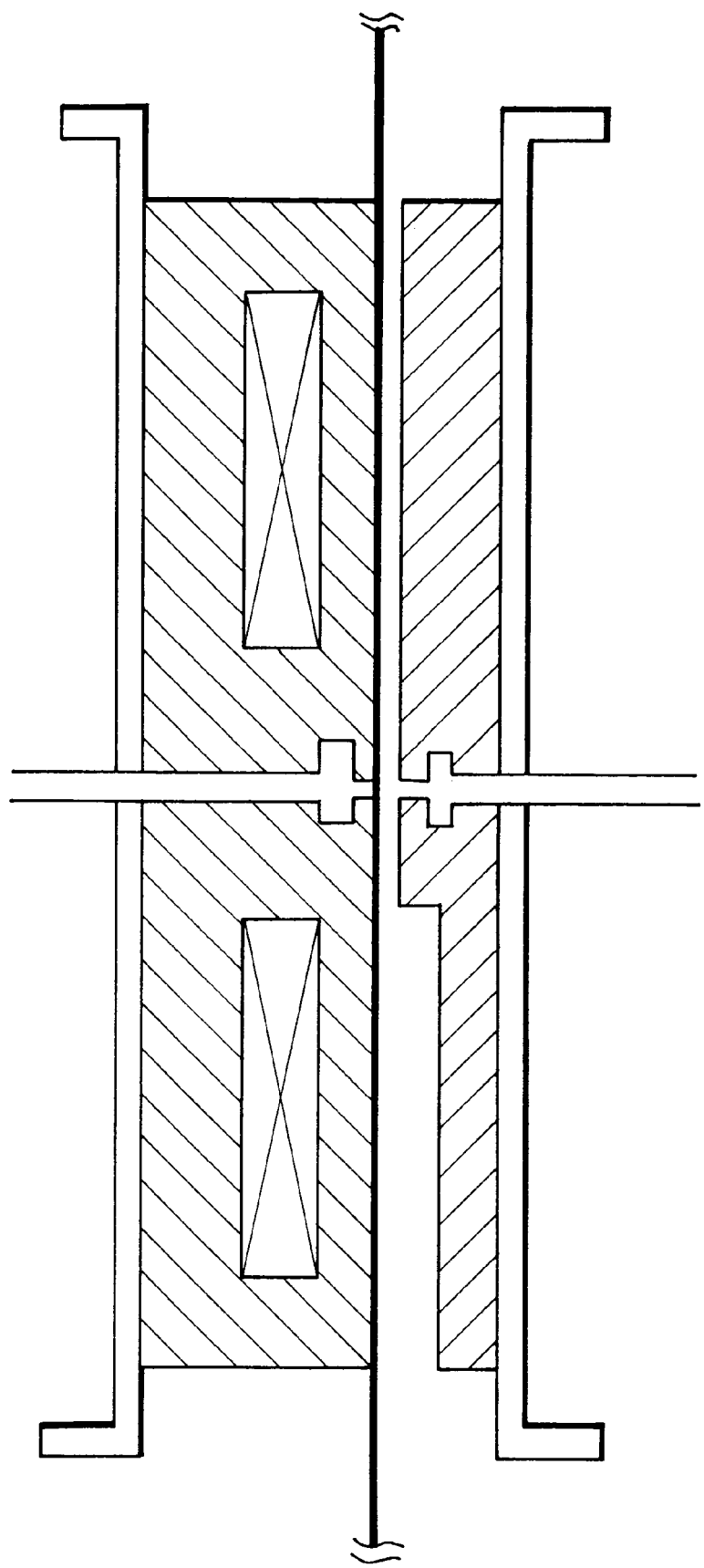
FIG. 16 is a schematic view illustrating a further example of the structure of a gas gate used in the apparatus according to the present invention.
Figure 17:
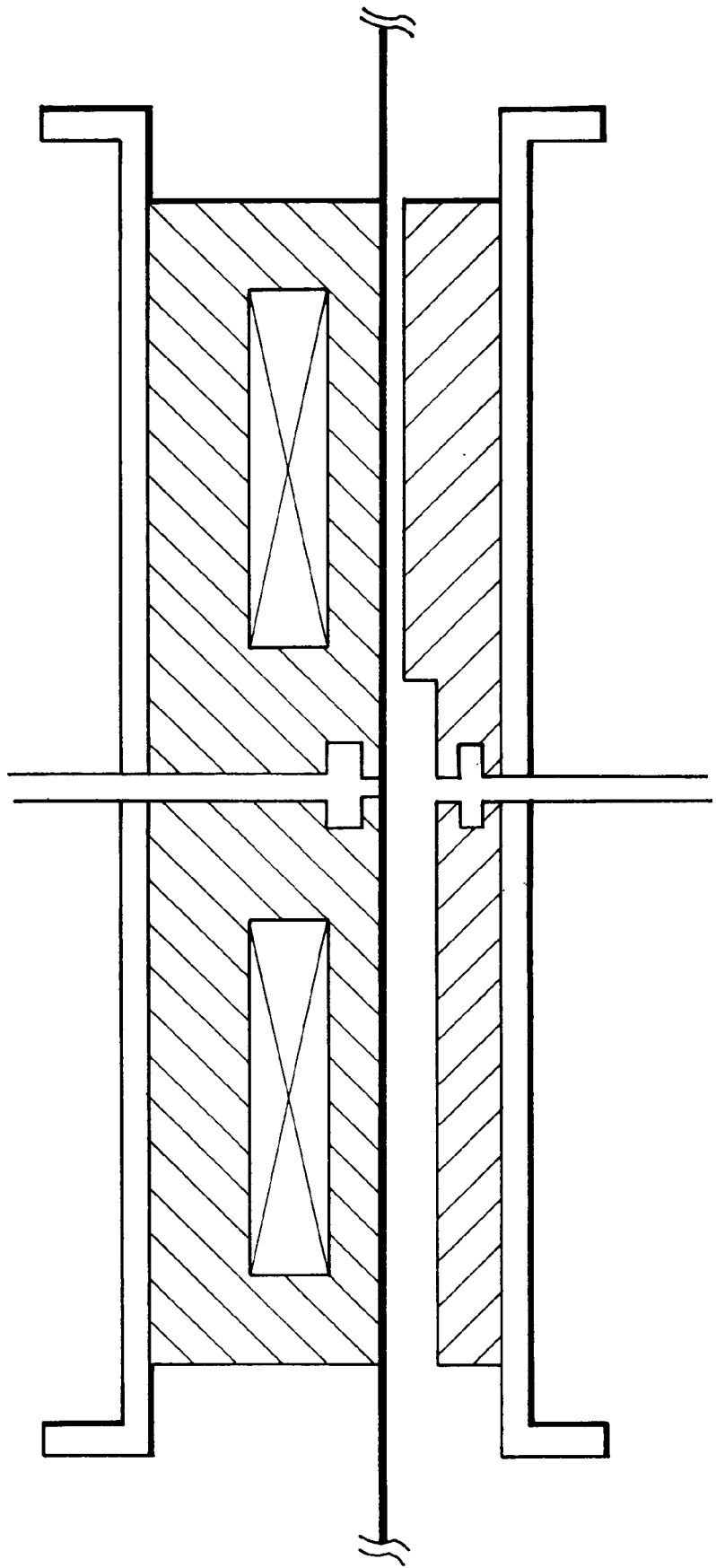
FIG. 17 is a schematic view illustrating a still further example of the structure of a gas gate used in the apparatus according to the present invention.
Figure 18:
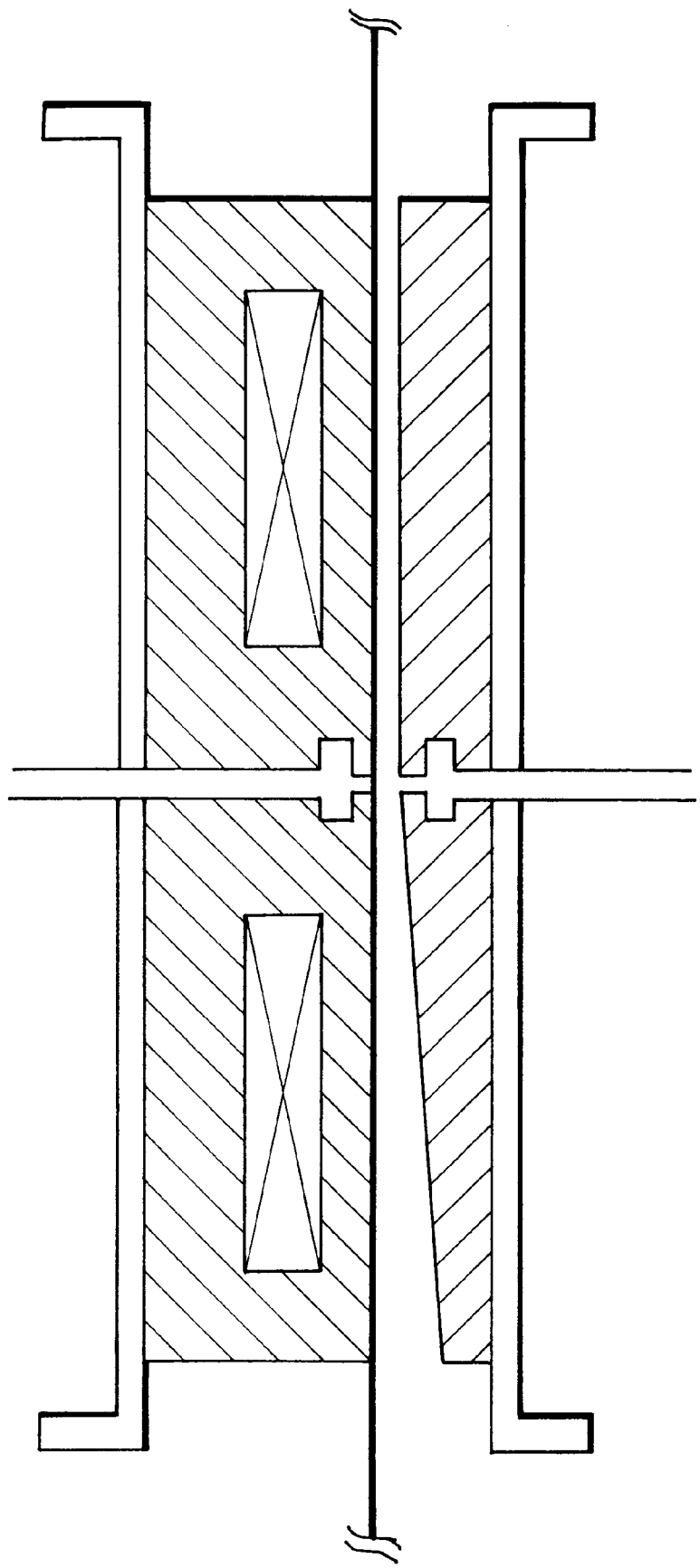
FIG. 18 is a schematic view illustrating a still further example of the structure of a gas gate used in the apparatus according to the present invention.

As well as in the case of Experiment A, experiments were conducted using the experimental apparatus shown in FIG. 9. As the gas gate 907 of the experimental apparatus, there was used each of the gas gates shown in FIGS. 16, 17 and 18. And for comparison purposes, there was used the gas gate shown in FIG. 10 as in the case of Experiment A. Each of the gas gates shown in FIGS. 16, 17 and 18 comprises a modification of the gas gate shown in FIG. 3 in which the dimensioned state of the slit height is partially modified as shown in each of said figures. In detail, the gas gate shown in FIG. 16 is of the configuration in which the start for the height of the slit 1601 to change on the side of the position where the gate gas is fed in the gas gate shown in FIG. 3 is shifted by a given distance toward the end thereof. The gas gate shown in FIG. 17 is of the configuration in which the start for the height of the slit 1701 to change on the side of the position where the gate gas is fed in the gas gate shown in FIG. 3 is shifted by a given distance toward the other side wherein the slit height is not changed. The gas gate shown in FIG. 18 is of the configuration in which the slit height changed portion of the gas gate shown in FIG. 3 is modified as such shown in FIG. 18 wherein the height of the slit 1801 is changed to have a cross section which is downward tapered from the position where the gate gas is fed.

In each of the above gas gates, the slit was dimensioned to have a length of 40 cm in the lengthwise direction of the substrate web and a width of 30.5 cm in the crosswise direction of the substrate web.

In more detail, the gas gate shown in FIG. 16 (hereinafter referred to as gas gate D) is of the configuration in which the position for the slit height to change in the gas gate A used in Experiment A is shifted by 10 cm toward the p-type amorphous silicon film-forming chamber 902 side. The gas gate shown in FIG. 17 (hereinafter referred to as gas gate E) is of the configuration in which the position for the slit height to change in the gas gate A used in Experiment A is shifted by 10 cm toward the i-type amorphous silicon film-forming chamber 901 side. The gas gate shown in FIG. 18 (hereinafter referred to as gas gate F) is of the configuration in which the slit height in the gas gate A used in Experiment A is varied, that is, the slit height is gradually widened from the gate gas introduction side toward the terminal of the gas gate on the p-type amorphous silicon film-forming reaction chamber 902 side.

The gas separation performance in each of the three cases was examined in the same manner as in Experiment A.

The evaluated results obtained in each of the three cases wherein each of the gas gates D, E and F was used are collectively shown in Table 4 in which the evaluated results obtained in the case wherein the conventional gas gate was used are also shown.

From the results shown in Table 4, it was found that the gas separation performance in the case of using any of the gas gates D, E and F surpass that in the case of using the gas gate C.

Experiment C

As well as in the case of Experiment A, experiments were conducted using the experimental apparatus shown in FIG. 9. As the gas gate 907 of the experimental apparatus, there was used a gas gate of the configuration shown in FIG. 5. The gas separation performance thereof was evaluated by conducting film formation in the same manner as in Experiment B.

As for the gas gate shown in FIG. 5 (hereinafter referred to as gas gate G), the slit thereof is dimensioned to have a relatively narrow zone between the position where the gate gas is introduced and the i-type amorphous silicon film-forming reaction chamber 901 and a relatively wide zone between the position where the gate gas is introduced and the p-type amorphous silicon film-forming reaction chamber 902. In the gas gate G, the structure of the wall face of the gas gate opposite the deposition face of the substrate web on which a deposited film is to be formed (that is, the under surface) is the same as that in the gas gate A shown in FIG. 3. The gas gate G is, however, different from the gas gate A in that the wall face opposite the non-deposition face (that is, the upper surface) of the substrate web in the former is structured such that the substrate web can be stably moved while being supported.

In FIG. 5, reference numeral 501 indicates a slit-like shaped gas separation passageway of the gas gate, reference numeral 504 indicates a substrate web, reference numeral 505 indicates a magnet which serves to support the substrate web in a state of being in contact with the gas gate face which meets the substrate web to be transported by virtue of a magnetic power of the magnet, and reference numeral 507 indicates a gate gas feed pipe which serves to feed gate gas into the gas gate. Reference numeral 508 indicates a rotatable roller made of stainless steel of 30 mm in outer diameter in which the magnet 505 is installed. The rotatable roller 508 has a function to transport the substrate web 504 while rotating. Herein, the rotatable roller 508 is disposed such that the surface thereof contacts with the substrate web 504 at a position about 0.5 mm distant from the inner wall face of the slit which opposes the non-deposition face of the substrate web to support and transport the substrate web.

The slit of the gas gate G shown in FIG. 5 is of 40 cm in length in the lengthwise direction of the substrate web and 30.5 cm in width in the crosswise direction of the substrate. The gate gas feed pipe is disposed such that the outlet thereof is positioned at the center of the slit in the direction of the substrate web to be moved. The size of the gate gas feed pipe is the same as that of the gate gas feed pipe in the conventional gas gate C.

The evaluated results obtained are shown in Table 5. From the results shown in Table 5, it was found that the gas separation performance of the gas gate G surpasses that of the conventional gas gate C.

Experiment D

As above described, in Experiments A, B and C, the effects relating to the gas separation performance were examined in various cases wherein the slit height of the gas gate was varied in the lengthwise direction of the substrate web. In this experiment, observation was made of the interrelation between a gas pressure distribution in the slit as the gas separation passageway of the gas gate and the gas separation performance of the gas gate.

Figure 11:
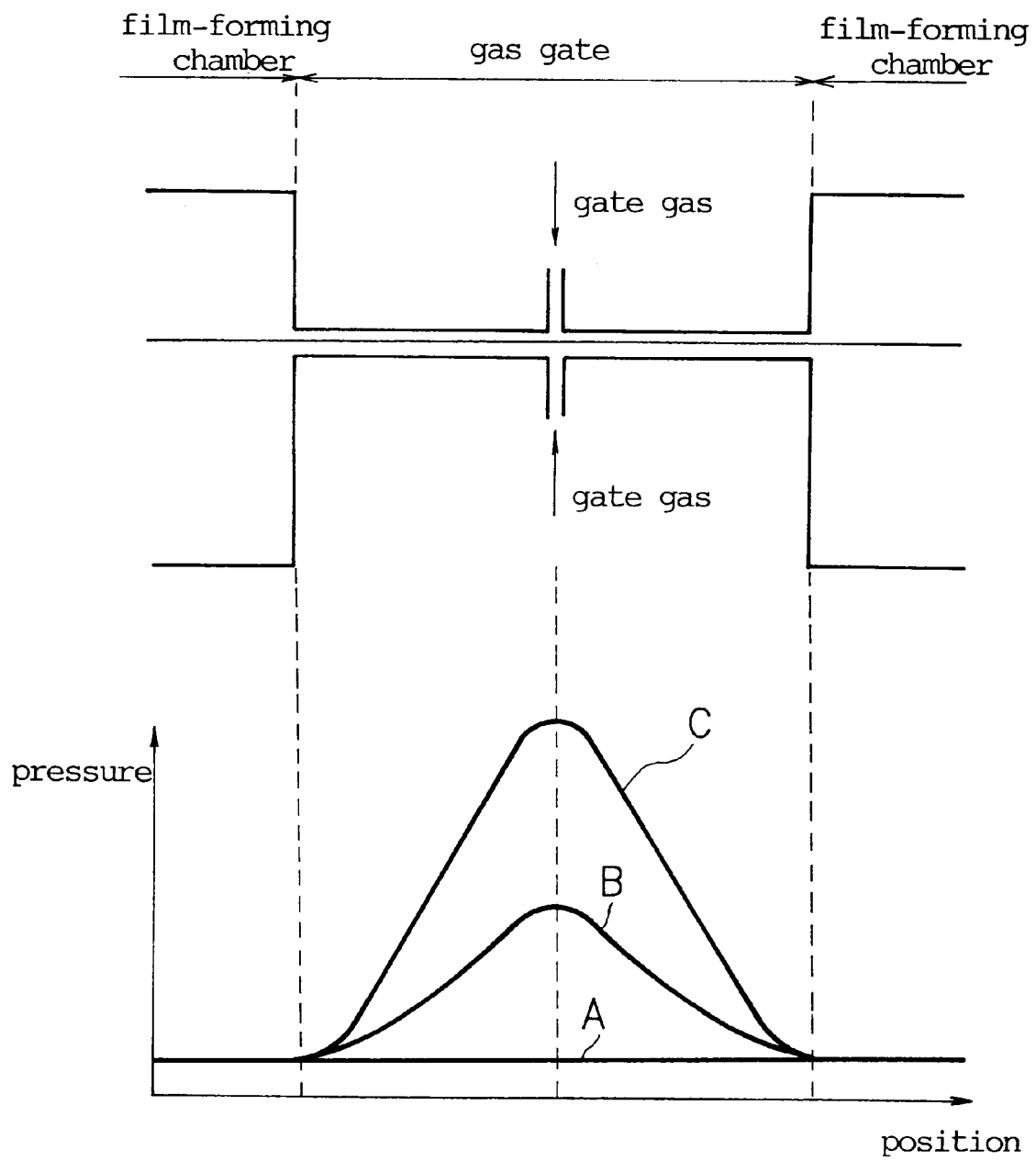
FIG. 11 is a schematic view illustrating gas pressure distributions in a gas gate in the case where a substantial difference is not present between the two inner pressures upon film formation of the adjacent film-forming chambers which are communicated with each other by the gas gate.

In the case where the two adjacent reaction chambers which are communicated with each other by a gas gate are the same in terms of inner pressure upon film formation, when gate gas is introduced into the gas gate, the gas pressure in the slit as the gas separation passageway becomes maximum at the position where the gate gas is introduced. This situation can be easily understood with reference to the graph shown in FIG. 11. In FIG. 11, there are shown a straight line A and curves B and C. The straight line A shows a tendency of the gas pressure in the slit in the case where no gate gas is fed. The curve B shows a tendency of the gas pressure in the slit in the case where a relatively small amount of gate gas is fed. The curve C shows a tendency of the gas pressure in the slit in the case where a relatively great amount of gate gas is fed.

As apparent from FIG. 11, it is understood that in the case where the two adjacent reaction chambers which are communicated with each other by a gas gate are the same in terms of inner pressure upon film formation, when the amount of the gate gas to be introduced is increased as shown by the curve C, the gas pressure at the position where the gate gas is introduced is heightened whereby two gas flow streams respectively directed toward one of the opposite reaction chambers from the position where the gate gas are established. By this, film-forming raw material gases used in one of the adjacent chambers are effectively prevented from contaminating into the other reaction chamber. However, in the case where the inner pressure upon film formation of one of the two adjacent reaction chambers is different from that of the other reaction chamber, the above situation wherein the gas pressure in the slit as the gas separation passageway of the gas gate becomes maximum at the position where the gate gas is introduced is hardly provided. This situation can be easily understood with reference to the graph shown in FIG. 12. In FIG. 12, there are shown a curve A indicating a tendency of the gas pressure in the slit in the case where no gate gas is introduced, a curve B indicating a tendency of the gas pressure in the slit in the case where a relatively small amount of the gate gas is introduced, and a curve C indicating a tendency of the gas pressure in the slit in the case where a relatively great amount of the gate gas is introduced. As apparent from FIG. 12, it is understood that in the case where the two adjacent reaction chambers which are communicated with each other by a gas gate are different in terms of inner pressure upon film formation, the gas pressure distribution in the slit of the gas gate is not uniform but is variously changed, being different from the foregoing case.

Figure 13:
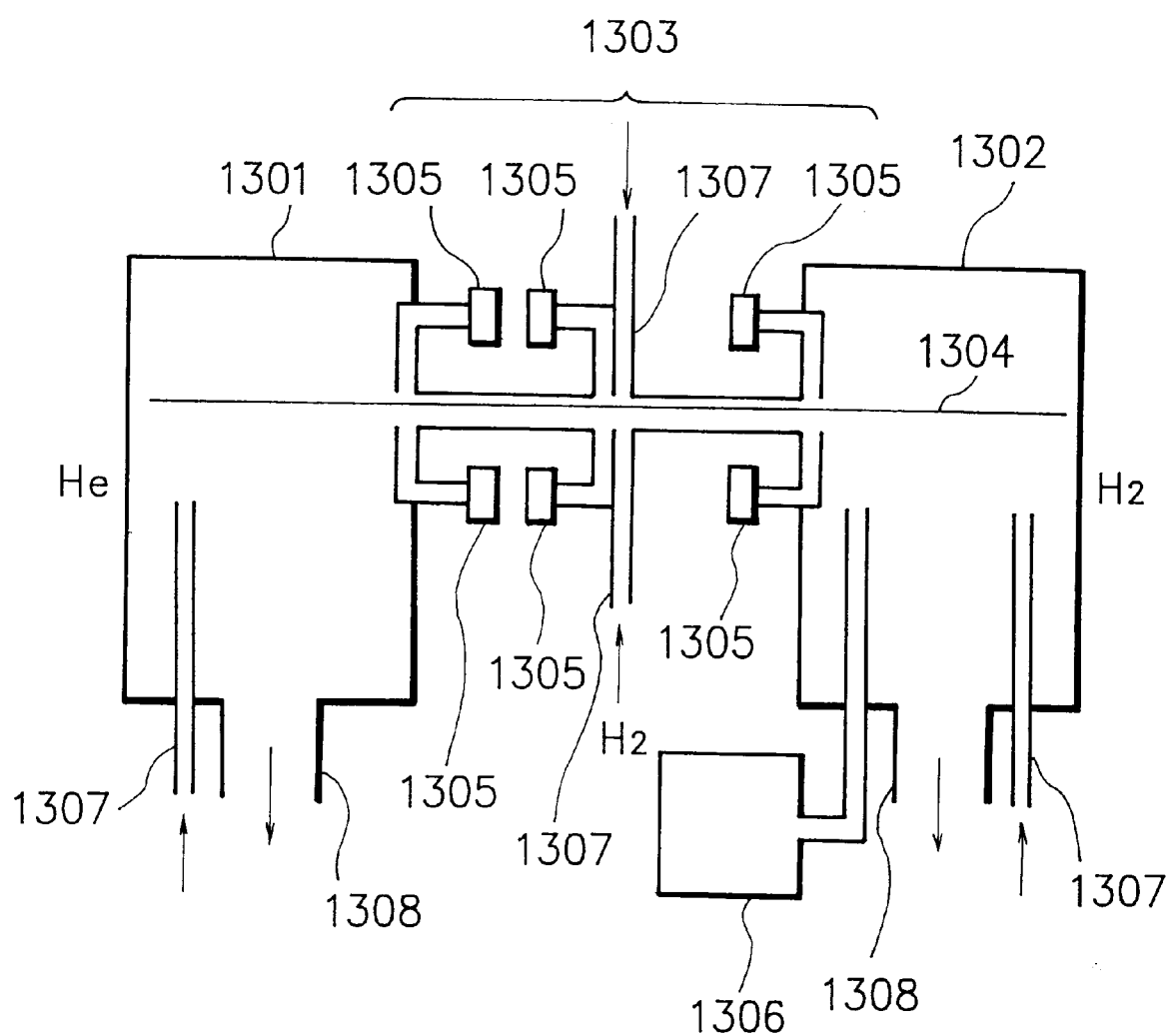
FIG. 13 is a schematic view illustrating an experimental apparatus used for the evaluation of a performance of a gas gate.

In view of the above, in this experiment, as for the case where the inner pressure upon film formation of one of the two adjacent reaction chambers is distinctly different from that of the other reaction chamber, observation was made of the interrelation between the gas pressure distribution in the gas gate and the gas separation performance using an apparatus of the constitution shown in FIG. 13.

In FIG. 13, reference numeral 1301 indicates a reaction chamber which operates at a relatively high inner pressure upon film formation, and reference numeral 1302 indicates reaction chamber which operates at an inner pressure upon film formation which is lower than the inner pressure of the reaction chamber 1301. Reference numeral 1303 indicates a gas gate by which the reaction chamber 1301 and the reaction chamber 1302 are communicated with each other. Reference numeral 1304 indicates a substrate web which is moved among the two reaction chambers through the gas gate 1303. Reference numeral 1305 indicates a pressure gage, reference numeral 1306 indicates a quadrupole mass spectrometer, and reference numeral 1307 indicates a gas feed pipe. Each of the reaction chambers 1301 and 1302 is provided with an exhaust pipe 1308 which serves to evacuate the inside thereof.

In this experiment, there were used $H_2$ gas and He gas instead of the film-forming raw material gas. The $H_2$ gas was introduced into the low inner pressure reaction chamber at a flow rate of 200 sccm. The He gas was introduced into the high inner pressure reaction chamber at a flow rate of 200 sccm. As the gate gas, there was used $H_2$ gas. $H_2$ gas as the gate gas was introduced into the gas gate through the gate gas feed pipe. The introduction of this $H_2$ gas as the gate gas was repeated at a different flow rate in each case. In each case, the amount of the He gas flown into the low inner pressure reaction chamber from the high inner pressure reaction chamber through the gas gate was measured by the quadrupole mass spectrometer connected to the low inner pressure reaction chamber. And the gas pressure in the gas gate was measured using the pressure gage disposed at the gate gas feed pipe and the pressure gage disposed at the opening of each of the two reaction chambers. In each case, the inner pressure of the low inner pressure reaction chamber was made constant at 5 mTorr, and the inner pressure of the high inner pressure chamber was made to be 1 Torr and 0.75 Torr.

Figure 14:
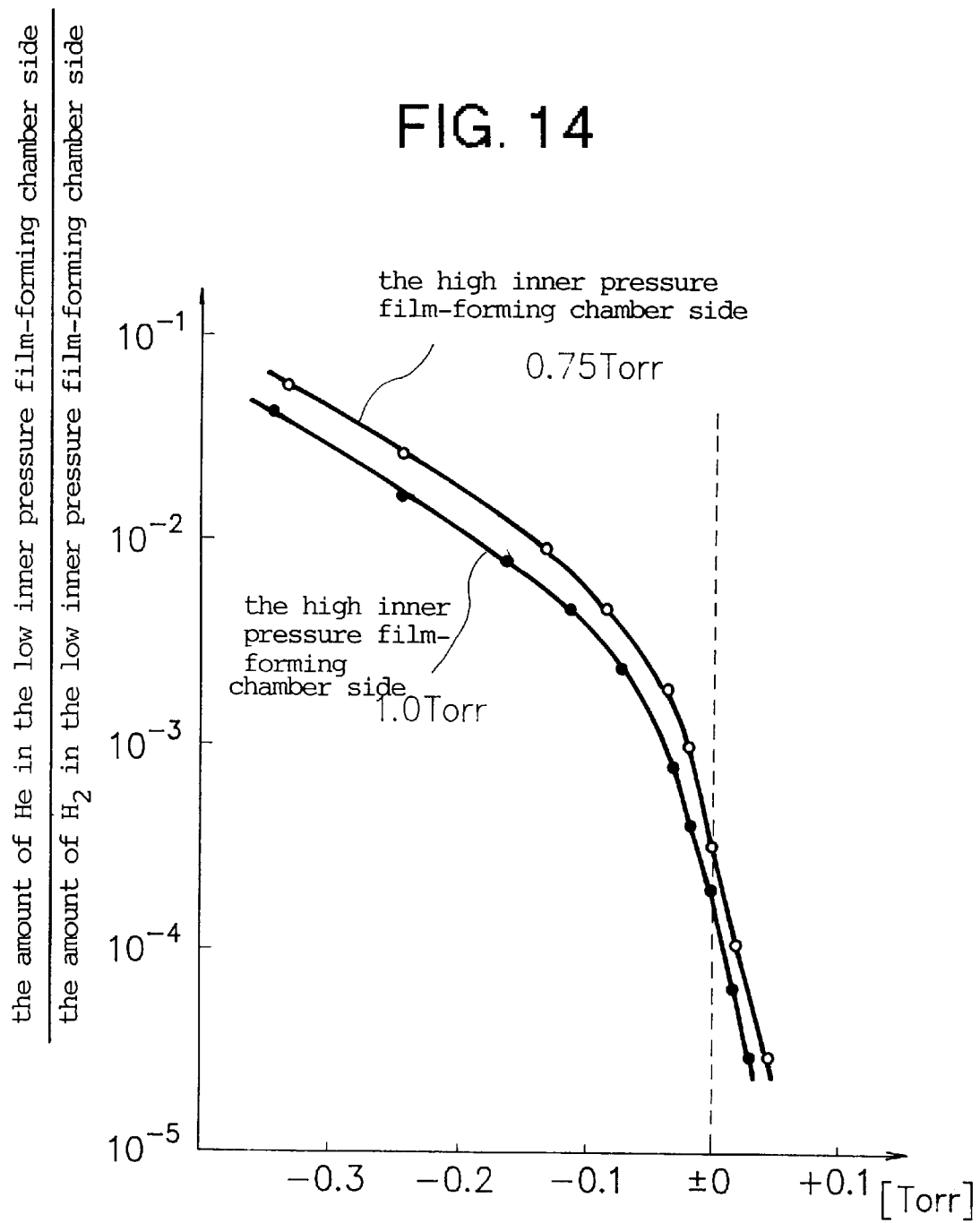
FIG. 14 shows a graph indicating the interrelations between the gas pressure in a gas gate and the gas separation performance.
Figure 15A:
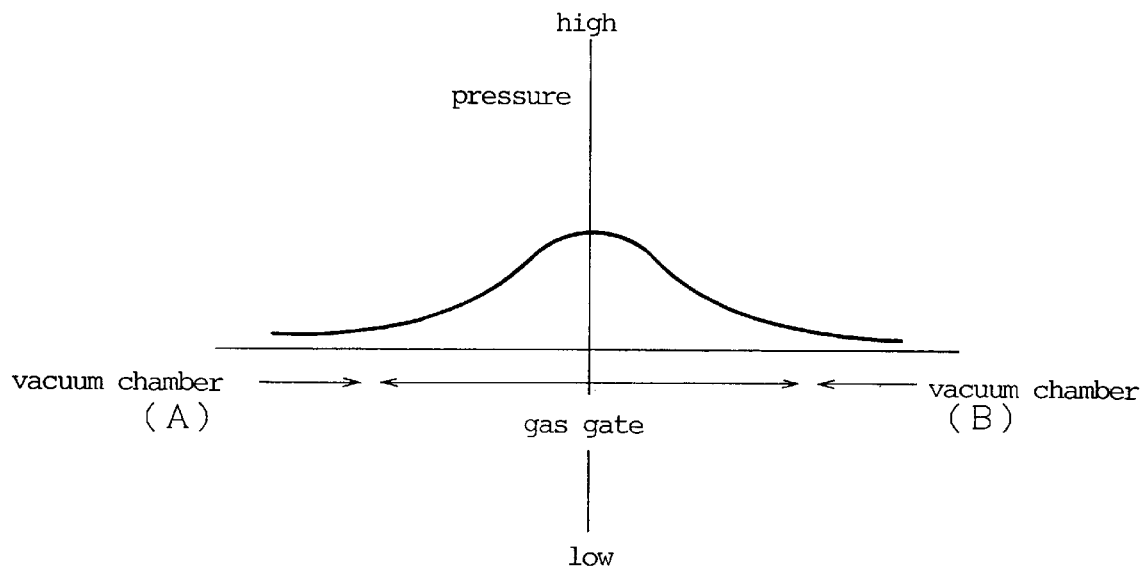
FIG. 15(A) shows a schematic graph indicating a gas pressure gradient in a gas gate.
Figure 15B:
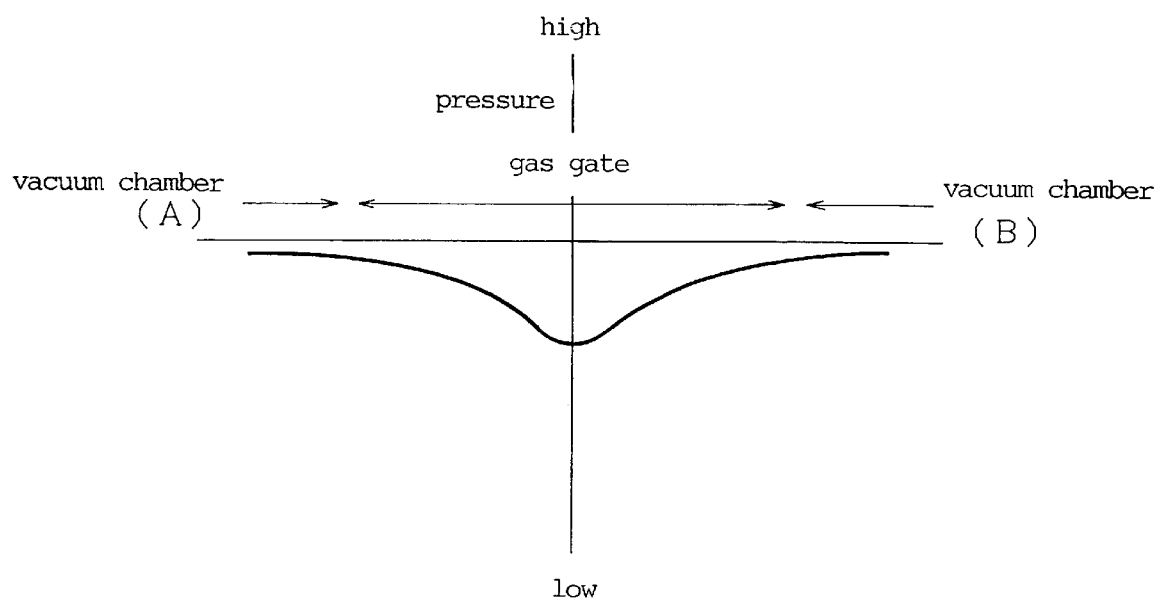
FIG. 15(B) shows a schematic graph indicating another gas pressure gradient in a gas gate.

The results obtained in the above are graphically shown in FIG. 14. From the results graphically shown in FIG. 14, it was found that there is a definite interrelation between the amount of the gas flown into the low inner pressure reaction chamber from the high inner pressure reaction chamber and the inner pressure in the slit of the gas gate. Particularly, there was obtained findings that in the case where the gas pressure at the position in the gas gate where the gate gas is introduced is heightened by increasing the amount of the gate gas to be introduced, the amount of the gas (He gas) flown into the low inner pressure reaction chamber from the high inner pressure reaction chamber is decreased as the gas pressure at the position where the gate gas is introduced is heightened due to an increase in the amount of the gate gas to be introduced; and in the region wherein the gas pressure at the position where the gate gas is introduced is higher than the gas pressure at the opening of the high inner pressure reaction chamber, the amount of the gas flown into the low inner pressure reaction chamber from the high inner pressure reaction chamber is markedly decreased, wherein the gas gate provides a greatly improved gas separation performance.

In the following, the present invention will be described while referring to the drawings.

Figure 1:
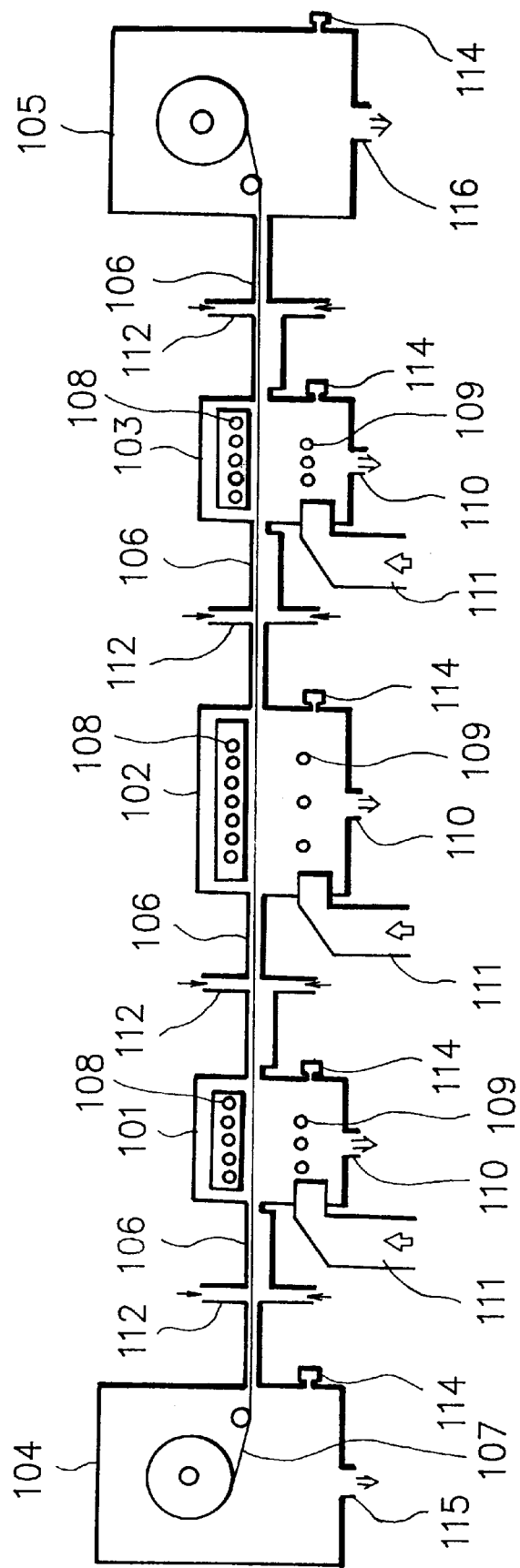
FIG. 1 is a schematic view illustrating an embodiment of an apparatus for continuously forming a semiconductor element according to the present invention.

FIG. 1 is a schematic view illustrating the constitution of an embodiment of an apparatus for continuously producing a semiconductor element according to the present invention. In FIG. 1, each of reference numerals 101, 102 and 103 indicates a microwave plasma CVD film-forming chamber. Reference numeral 104 indicates a substrate web feed chamber, and reference numeral 105 indicates a substrate web take-up chamber. Each pair of the adjacent film-forming chambers are communicated with each other by means of a gas gate 106. Reference numeral 107 indicates a substrate web which is delivered from the substrate web feed chamber in which a reel having the substrate web wound therearound is disposed, moved toward the substrate web take-up chamber while passing through the respective film-forming chambers during which a functional deposited film is formed on the surface thereof, and is taken up by a take-up reel disposed in the substrate web take-up chamber, wherein a functional deposited film comprising three layers being stacked, specifically, a semiconductor film having a pin structure for solar cell is formed on the substrate web.

Each of the film-forming chambers 101 to 103 is provided with a heater which serves to heat the substrate web, a gas supply pipe 109 which serves to supply film-forming raw material gas from a gas reservoir (not shown) into the film-forming chamber, an exhaust pipe 110 which serves to evacuate the inside of the film-forming chamber by means of a vacuuming device (not shown), and a waveguide 111 extending from a microwave power source (not shown) which serves to apply a microwave energy to the film-forming raw material gas whereby causing glow discharge in the film-forming chamber, wherein film deposition is conducted by the microwave plasma CVD process. Each of the gas gates 106 is provided with a separation gas feed pipe 112 capable feeding separation gas into the gas gate. Each gas gate is provided with a slit-like shaped gas separation passageway dimensioned such that it has a given size on the side situated between one of the adjacent film-forming chambers and the outlet of the separation gas feed pipe in the gas separation passageway and a greater size than said given size on the side between said outlet of the separation gas feed pipe and the remaining film-forming chamber respectively in terms of slit height in the lengthwise direction of the substrate web to be moved. By this, there is established a principal stream of the separation gas on the side with a relatively large conductance, namely, on the side having a greater slit height, wherein the respective film-forming gases used in the adjacent film-forming chambers are effectively prevented from being diffused or mixed with each other.

Reference numeral 114 indicates a pressure gage. Each of the substrate web feed chamber and the substrate web take-up chamber is provided with an exhaust pipe 115 or 116 which serves to evacuate the inside thereof.

Figure 2:
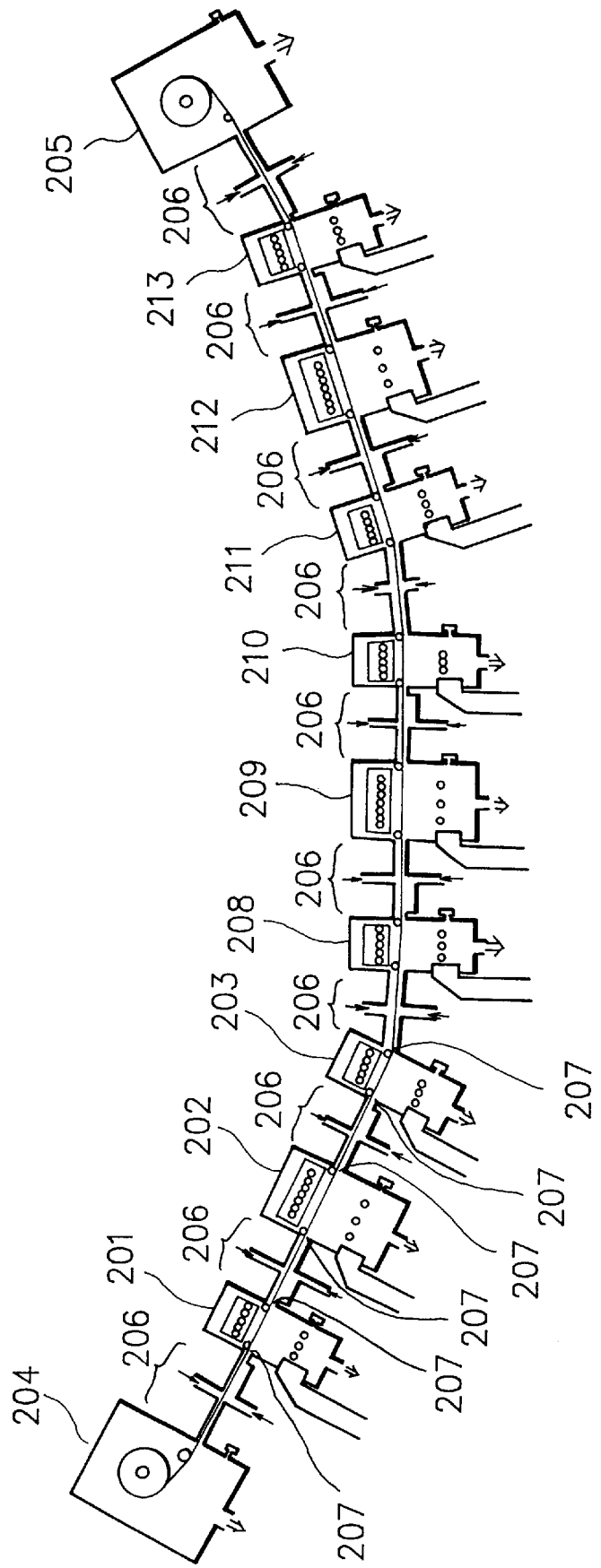
FIG. 2 is a schematic view illustrating another embodiment of an apparatus for continuously forming a semiconductor element according to the present invention.

FIG. 2 is a schematic view illustrating another embodiment of an apparatus for continuously producing a semiconductor element according to the present invention. The apparatus shown in FIG. 2 basically comprises six film-forming chambers and six gas gates being arranged in series which are added to the apparatus shown in FIG. 1. The meaning of each of reference numerals 201 to 206 is the same as that of each of the reference numerals 101 to 106 in FIG. 1.

In this apparatus, the film-forming chambers are arranged in accordance with the form provided by the substrate web when hung down by its own weight. Each of the film-forming chambers is provided with two rotatable supporting rollers one in the vicinity of the entrance and the other in vicinity of the exit which serve to support the substrate web from the rear side for the purpose of maintaining the substrate web in a horizontal state in the film-forming chamber. The film-forming chamber 208 to 213 are ones which operate by the microwave plasma CVD process as well as the film-forming chambers 201 to 203.

According to the apparatus shown in FIG. 2, there can be continuously formed a deposited film comprising nine layers being stacked, specifically, a semiconductor layer with a pin/pin/pin structure for solar cell on the substrate web by the microwave plasma CVD process.

Description will be made of the gas gate according to the present invention. The gas gate according to the present invention is characterized by having a slit-like shaped separation passageway dimensioned to be positionally varied in the lengthwise direction of the substrate web to be moved in terms of slit height in the gas separation passageway, wherein the conductance in the separation passageway can be properly changed. This makes it possible to properly control the stream of the separation gas introduced into the gas gate through the separation gas feed pipe, whereby mutual diffusion or admixture of the respective film-forming raw material gases used in the adjacent film-forming chambers communicated with each other through the gas gate can be minimized as desired.

Specific examples of the gas gate in the apparatus according to the present invention are gas gates of the configuration shown in each of FIGS. 3, 16, 17 and 18.

FIG. 3 is a schematic view illustrating an example of the gas gate in the apparatus according to the present invention. This gas gate has a slit-like shaped gas separation passageway 301 which is dimensioned to have a given size on one side about the outlet of a separation gas feed 307 as the center and a greater size as much as two times over said given size on the other side in terms of slit height in the lengthwise direction of a substrate web 304 in the gas separation passageway. In this gas gate, the substrate web 304 is supported by virtue of a magnetic force of a magnet 305 disposed in an open cross-section adjusting member 306 as an upper wall face forming member of the gas separation passageway, wherein said magnetic force is effected to the rear side of the substrate web.

Each of the gas gates shown in FIGS. 16, 17 and 18 comprises a partial modification of the gas gate shown in FIG. 3 in which the slit height distribution in the lengthwise direction of the substrate web in the gas gate shown in FIG. 3 is modified as shown in each of these figures.

As previously described, the term "slit height of the gas gate" in the present invention means a length of the slit-like shaped gas separation passageway in the thicknesswise direction of the substrate web in terms of an effective height of the gas passageway obtained by reducing the thickness of the substrate web from the distance between the opposite inner wall faces of the gas gate in the thicknesswise direction of the substrate web.

In the present invention, it is desired for the slit height to be low in the viewpoint of providing a high gas separation performance with the use of a relatively small amount of the gate gas. However, in order to prevent the surface of the substrate web on which a film is to be formed from being damaged as a result of vibrating or waving to contact with the inner wall face of the gas gate upon moving the substrate web, it is necessary to establish a certain clearance between the substrate web and the inner wall face of the gas gate. In view of this, the slit height at the lowest portion is desired to be preferably in the range of 0.5 to 10 mm, more preferably in the range of 1 to 5 mm, most preferably in the range of 2 to 3 mm.

In the present invention, the slit height is designed such that it is relatively small on the side of a film-forming chamber in which a film formed is doped with an impurity and is relatively great on the side of a film-forming chamber in which a film formed is not doped with an impurity, in order to shift the main stream of the gate gas toward the former film-forming chamber in which the impurity doping is conducted. Particularly, the lower limit of the slit height on the side of the film-forming chamber in which the impurity doping is not conducted is eventually decided in the viewpoint of establishing the foregoing clearance in order to attain smooth transportation of the substrate web without being damaged, and based on this, the slit height on the side of the film-forming chamber in which the impurity doping is conducted is designed to be greater than the slit height on the side of the film-forming chamber in which the impurity doping is not conducted.

Referring to the gas gate shown in FIG. 3 which is of the basic configuration for the gas gate according to the present invention, the position for the gate gas to be introduced into the gas gate is situated substantially at the center of the gas gate in the lengthwise direction of the substrate web.

Herein, considering a gas gate of the configuration in which the slit height is stepwise varied at the position where the gate gas is introduced, if the ratio between the slit height on the side of the film-forming chamber in which the impurity doping is conducted and the slit height on the side of the film-forming chamber in which the impurity doping is not conducted is close to 1, such gas gate is similar to the conventional gas gate in terms of structure and the gas separation performance thereof is similar to that of the conventional gas gate, wherein the effects of the present invention are hardly provided.

In the present invention, it is essential for the ratio between the slit height on the side of the film-forming chamber in which the impurity doping is conducted and the slit height on the side of the film-forming chamber in which the impurity doping is not conducted to exceed 1.

Upon raising the above ratio between the different slit heights, when there is employed a manner wherein the slit height on the side of the film-forming chamber in which the impurity doping is conducted is enlarged while fixing the slit height on the side of the film-forming chamber in which the impurity doping is not conducted at a predetermined value, the conductance of a slit-like shaped gas passageway having a height which is smaller than the width thereof is increased substantially in proportion to the square of the slit height. Particularly, when the slit height between the position where the gate gas is introduced and the film-forming chamber in which the impurity doping is not conducted is fixed at a predetermined value and the slit height between the position where the gate gas is introduced and the film-forming chamber in which the impurity doping is conducted is raised such that the ratio between the two slit heights is, for example, doubled, the conductance between the position where the gate gas is introduced and the film-forming chamber in which the impurity doping is not conducted is increased as much as about four times over that of the opposite side, resulting in increasing the conductance of the entire gas gate as much as about 2.5 times.

As apparent from the findings obtained in the foregoing Experiment D, in the case where there is a difference between the inner pressure upon film formation of one of the adjacent film-forming chamber and that of the remaining film-forming chamber, when the gas pressure at the position where the gate gas is introduced is lower than that of the high inner pressure film-forming chamber, the gas separation performance is markedly reduced. This means that in the case where the conductance of the entire gas gate is heightened, the probability for the film-forming raw material gases used in the high inner pressure film-forming chamber to be flown into the low inner pressure film-forming chamber through the gas gate is increased, wherein if the gas pressure at the position where the gate gas introduced is lower than that of the high inner pressure film-forming chamber, there is caused a significant reduction in terms of gas separation performance.

It is considered that the occurrence of such a significant reduction for the gas separation performance could be avoided if it is possible to properly adjust the foregoing ratio between the two slit heights as desired without causing a change in the conductance of the entire gas gate. However, as described above, there is a lower limit for the slit height in the viewpoint of attaining smooth transportation of the substrate web without being damaged. In addition to this, it is understood that there is an upper limit therefor in order to properly adjust the foregoing ratio between the two slit heights without causing a change in the conductance of the entire gas gate. This upper limit is eventually decided depending upon the magnitude of a difference between the gas pressure of the high inner pressure film-forming chamber and that of the low inner pressure film-forming chamber, wherein it is low in the case where said pressure difference is large, and it is high in the case where said pressure difference is small.

As for the case wherein the conditions capable of providing a sufficient gas separation performance for the conventional gas gate cannot be obtained in the case wherein the inner pressure upon film formation of the film-forming chamber in which impurity doping is conducted is high as much as more than ten times over the inner pressure upon film formation of the film-forming chamber in which no impurity doping is conducted, observation was made of the above upper limit for the ratio with regard to the two slit heights by using each of the foregoing gas gates according to the present invention. As a result, it was found that the upper limit for the ratio with regard to the two slit heights is specifically about 3 in every case. Similarly, as for the case wherein the inner pressure upon film formation of the film-forming chamber in which impurity doping is conducted is high as much as about hundred times over the inner pressure upon film formation of the film-forming chamber in which no impurity doping is conducted, observation was made of the above upper limit for the ratio with regard to the two slit heights by using each of the foregoing gas gates according to the present invention. As a result, it was found that the upper limit for the ratio with regard to the two slit heights is specifically about 2 in every case.

As a result of further studies based on the above findings, it was found that the gas gate according to the present invention is desired to have a difference in terms of slit height such that the slit height on the side of the film-forming chamber in which impurity doping is conducted is higher as much as preferably 1.1 to 3 times or more preferably 1.2 to 2 times over the slit height on the side of the film-forming chamber in which no impurity doping is conducted.

As for the slit height distribution in the lengthwise direction of the substrate web in the gas gate of the apparatus according to the present invention, it is designed such that it is relatively low in the region between the position where the gate gas is introduced and the film-forming chamber in which no impurity doping is conducted and is relatively high in the region between the position where the gate gas is introduced and the film-forming chamber in which impurity doping is conducted.

Specific examples of the gas gate having such slit height distribution can include those gas gates shown in FIGS. 3, 16, 17 and 18 which were used in the foregoing experiments.

Each of the gas gates shown in FIGS. 16, 17 and 18 which are modifications of the gas gate shown in FIG. 3 has such characteristics and advantages as will be described below.

The gas gate shown in FIG. 16 is of the configuration in which the slit height starts varying at the position which is apart a bit from the the position where the gate gas is introduced on the side of the film-forming chamber in which impurity doping is conducted. This gas gate has an elongated narrow gas separation passageway and is relatively small in terms of conductance of the entire gas gate. Because of this, the gas gate can be effectively usable even in the case where a large difference is present between the inner pressure upon film formation of one of the adjacent film-forming chamber and that of the remaining film-forming chamber.

The gas gate shown in FIG. 17 is of the configuration in which the slit height starts varying at the position which is apart a bit from the the position where the gate gas is introduced on the side of the film-forming chamber in which no impurity doping is conducted and the varied slit height is extended toward the film-forming chamber in which impurity doping is conducted. This gas gate has an elongated wide gas separation passageway and the gas separation passageway around the position where the gate gas is introduced is wide. Because of this, the gas gate has advantages such that a relatively wide clearance is ensured for the transportation of the substrate web; the surface of the substrate web on which a film is to be deposited is hardly damaged even if it is vibrated or waved; and there is a slight occasion for foreign particles to deposit on the film deposition surface of the substrate web if those foreign particles are present, resulting in preventing occurrence of contamination of such foreign particles into a semiconductor element obtained.

The gas gate shown in FIG. 18 is of the configuration in which the slit height is varied such that it is gradually enlarged from the position where the gate gas is introduced toward the film-forming chamber in which impurity doping is conducted. Because of this, the gas gate has advantages such that turbulent gas flows, which are liable to occur in the case where a rapidly changed slit height is present, are hardly occurred; the gate gas is smoothly flown into the film-forming chamber in which impurity doping is conducted at a reduced flow rate; the state of plasma generated in said film-forming chamber is not disturbed by the gate gas flown; and the gate gas flown hardly causes contamination of foreign particles into a semiconductor element formed in the film-forming chamber.

In the present invention, in order to make the substrate web to be in contact with the open cross-section adjusting member in a desirable state and in order to prevent the substrate web from coming up even in the case where the substrate web is accompanied by certain waves or warpages, it is effective to employ a manner that a web member comprising a ferromagnetic body such as SUS 430 stainless steel is used as the substrate web and the web member is supported by virtue of a magnetic force in accordance with a conventional technique of supporting an object with the use of a magnet.

As the magnet used in this case, conventional magnets which can be used even at an elevated temperature while stably providing a desirable magnetic force without deteriorated and which do not release gases even when the environmental temperature is heightened can be selectively used. Specific examples of such magnets are rare earth ferromagnetic bodies such as samarium cobalt.

In the present invention, in order to attain efficient transportation of the substrate web in the gas gate, it is effective to use a further mechanism of supporting the substrate web comprising one or more rotatable rollers.

Figure 4A:
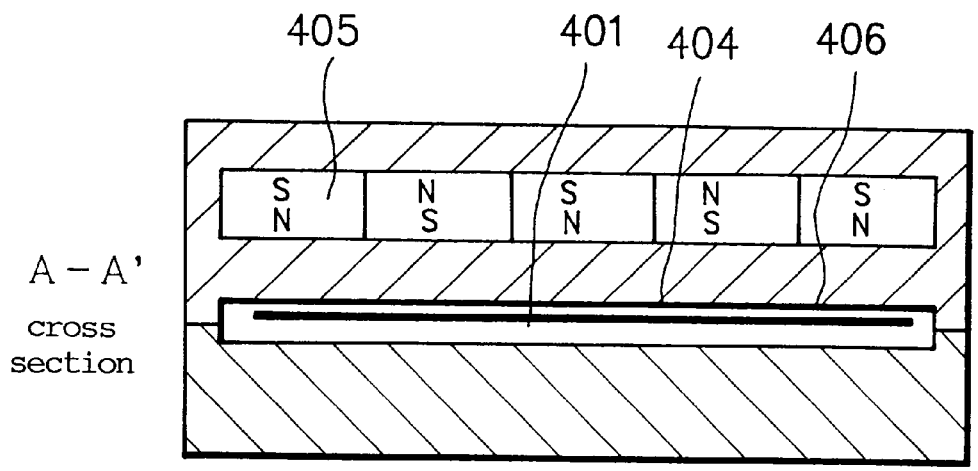
FIG. 4(A) is a schematic cross-section view, taken along the line A–A' in the gas gate shown in FIG. 3.
Figure 4B:
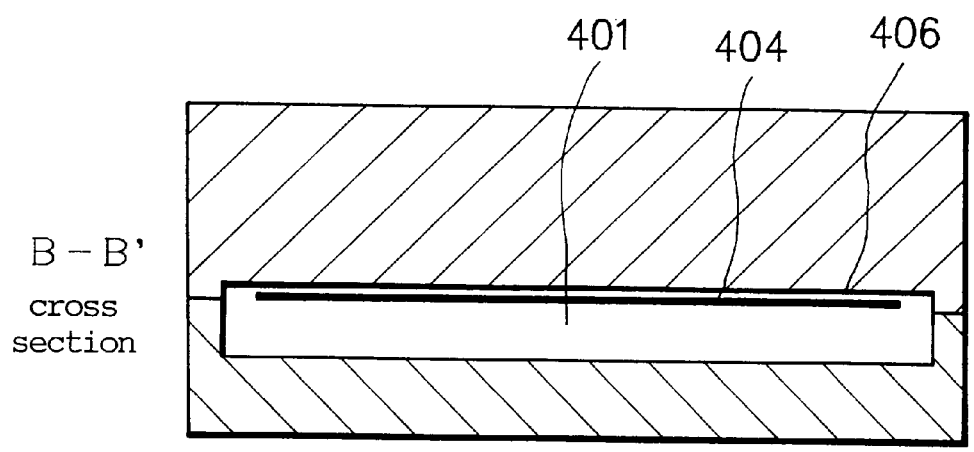
FIG. 4(B) is a schematic cross-section view, taken along the line B–B' in the gas gate shown in FIG. 3.
Figure 4C:
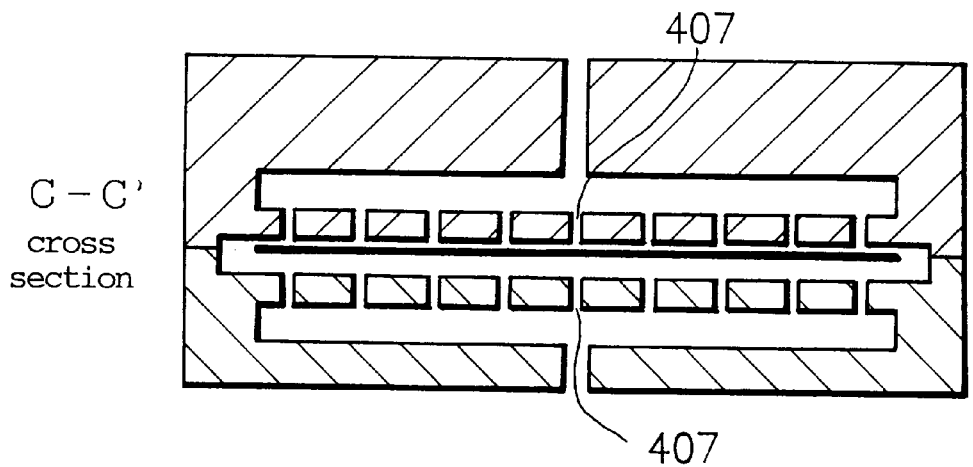
FIG. 4(C) is a schematic cross-section view, taken along the line C–C' in the gas gate shown in FIG. 3.

FIG. 4 is a schematic cross-section view of the gas gate shown in FIG. 3 used in the apparatus according to the present invention. FIG. 5 is a schematic view illustrating, as previously described, a partial modification of the gas gate shown in FIG. 3 used in the apparatus according to the present invention, in which a plurality of rotatable rollers 508 are disposed in the slit-like shaped gas separation passageway 501 such that the exterior of each of the rotatable rollers is partly projected from the open cross-section adjusting member 506 as the upper wall forming member of the gas separation passageway by which the rotatable rollers are held. These rotatable rollers are desired to be cylindrically shaped. In a preferred embodiment, these rotatable rollers are arranged such that their rotation axis is perpendicular to the direction of the substrate web to be moved and is substantially horizontal to the gas gate inner wall face and that their exterior is projected to a slight extent (particularly, an extent of 0.1 to 5 mm) from the gas gate inner wall face on the rear side of the substrate web in the slit-like shaped gas separation passageway of the gas gate.

Figure 6A:
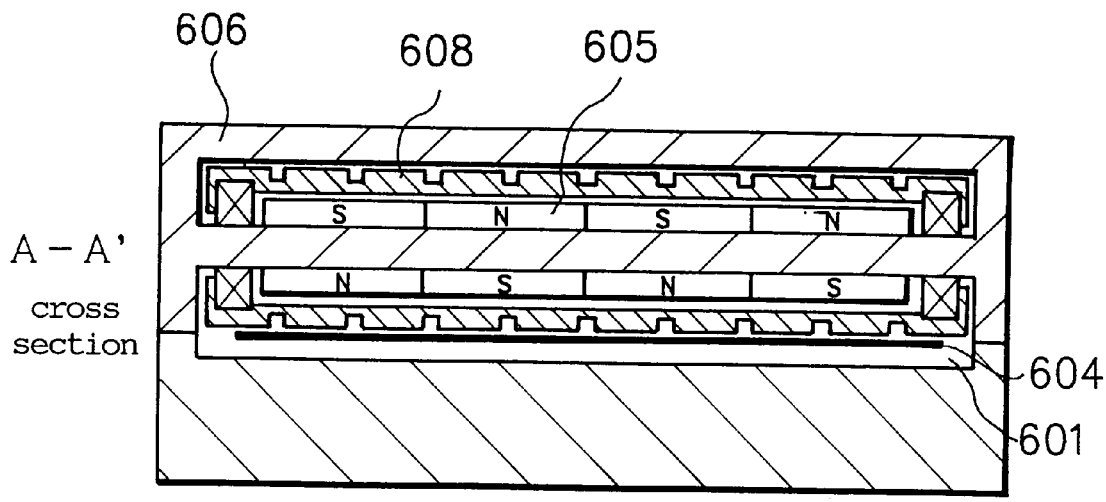
FIG. 6(A) is a schematic cross-section view, taken along the line A–A' in the gas gate shown in FIG. 5.
Figure 6B:
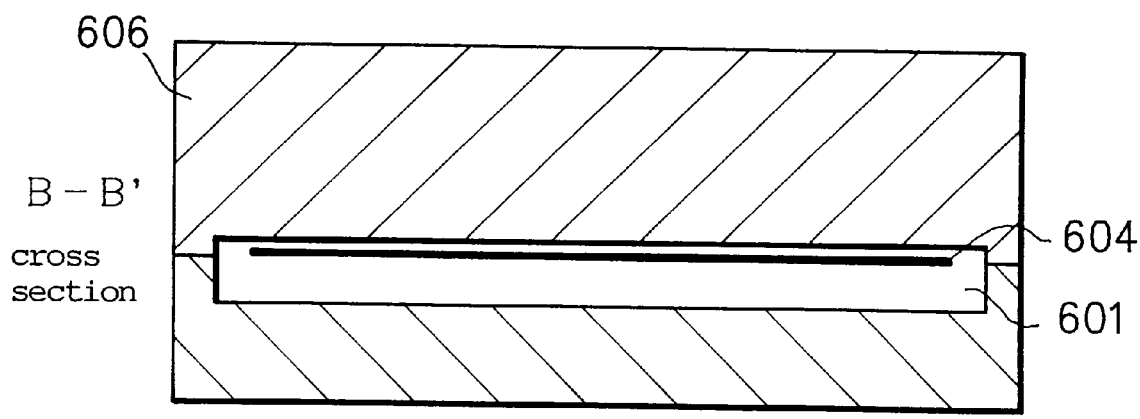
FIG. 6(B) is a schematic cross-section view, taken along the line B–B' in the gas gate shown in FIG. 5.
Figure 6C:
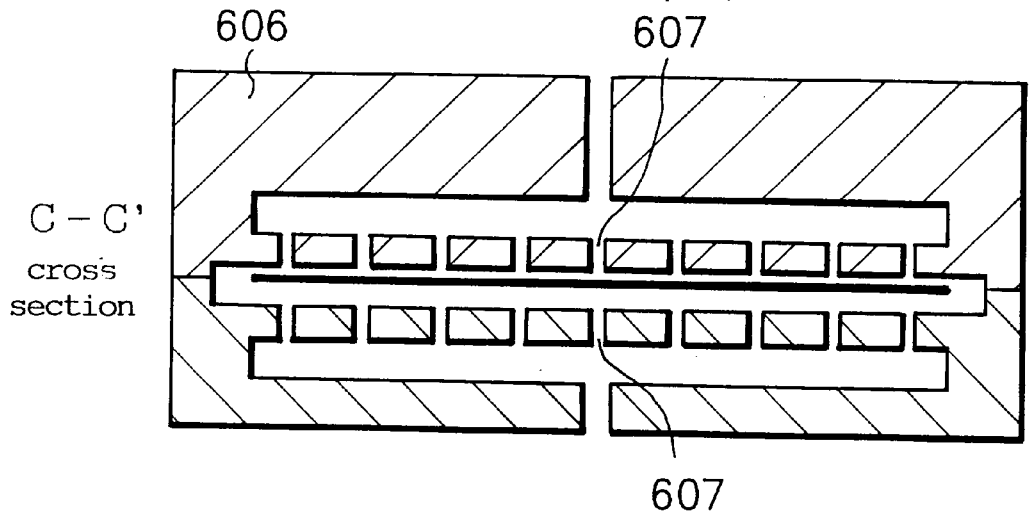
FIG. 6(C) is a schematic cross-section view, taken along the line C–C' in the gas gate shown in FIG. 5.

The number of rotatable rollers to be arranged should be properly determined while having due consideration so that the substrate web can be smoothly transported while being supported in a desirable state. Specifically, the number of the rotatable rollers to be arranged is different depending upon the size, weight, and constituent material of the substrate web used, the structure of the gas gate, and the like. However, in general, the rotatable rollers are arranged at an extent of 5 to 50/m in the direction of the substrate web to be moved. As for the size of the rotatable roller used, there is not any particular restriction. However, in general, it is desired to be of 5 to 50 mm in diameter. FIG. 6 is a schematic cross section view of the gas gate shown in FIG. 5 in the apparatus according to the present invention.

The separation gas to be introduced into the gas gate in the apparatus according to the present invention can include commercially available gases such as $H_2$ gas, He gas, and Ar gas. Only from the viewpoint of gas separation performance as for the separation gas, it is desirable to use such gas that is large in collision cross section and small in mean free path. Among the above mentioned gases, Ar gas can be the most desirably used in the case where a negative influence of Ar gas to glow discharge caused in the film-forming chamber involved can be neglected. In the case where the amount of H to be incorporated into a semiconductor film formed in the film-forming chamber involved is relatively large, $H_2$ gas is the most desirable. Further in the viewpoint that no negative influence is provided to both glow discharge caused and a semiconductor film formed in the film-forming chamber involved, He gas is the most desirable.

PRODUCTION EXAMPLES

The constitution and advantages of the present will be described in more detail by reference to the following production examples, which are provided here for illustrative purposes only, and are not intended to limit the scope of the present invention.

Production Example 1

There was continuously formed a pin junction amorphous silicon solar cell on a substrate web using the fabrication apparatus shown in FIG. 1 according to the present invention.

From the substrate feed chamber 104 containing a reel having a lengthy SUS430BA substrate web 107 of 30 cm in width, 50 m in length and 0.2 mm in thickness wound thereon, the substrate web was paid out, it was passed through the film-forming chambers 101 to 103, and fixed to a take-up reel in the substrate take-up chamber 105. Herein, each of the gas gates disposed between each pair of the adjacent chambers was designed such that the slit has a region with a slit height of 6 mm and another region with a slit height of 3 mm, and has a length of 40 cm.

Each of the film-forming chambers was sufficiently evacuated through the exhaust pipe 110. Thereafter, film-forming raw material gas was introduced into each of the film-forming chambers through the gas feed pipe 109, and the inner pressure of each of the film-forming chambers was adjusted to and maintained at a predetermined value by regulating the volume of the gas exhausted while confirming the pressure gage 114. Then, $H_2$ gas as the separation gas was introduced into the slit of each of the gas gates 106 from above and below directions through the gate gas feed pipe 112 at a flow rate of 200 sccm in total.

In each of the reaction chambers, the substrate web 107 was heated from the rear face thereof by energizing the heater 108 and it was maintained at a predetermined temperature. A predetermined microwave power was applied into each of the film-forming chambers through the waveguide 111, whereby glow discharge was caused, resulting in forming a deposited film on the substrate web in each of the film-forming chambers.

The above procedures were repeated while continuously moving the substrate web, to thereby continuously form an n-type amorphous silicon film, an i-type amorphous silicon film and a p-type amorphous silicon film on the substrate web. The film-forming conditions in each of the film-forming chambers are shown in Table 6.

The substrate web having the three amorphous silicon films stacked thereon was taken out from the roll-to-roll apparatus, and it was cut into pieces of 10 cm×10 cm in size to obtain a plurality of specimens.

Figure 7:
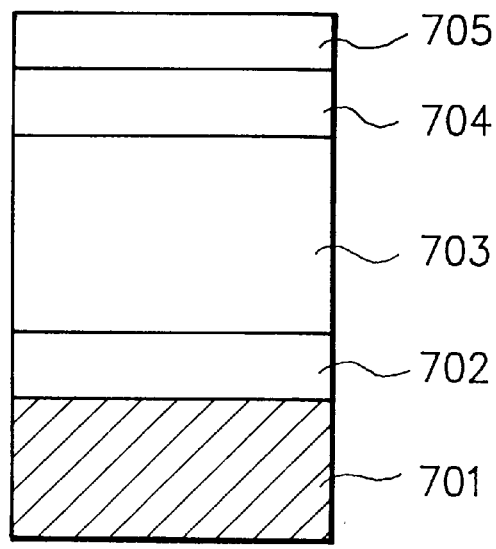
FIG. 7 is a schematic cross-section view illustrating the layer constitution of a solar cell produced in Production Example 1 of the present invention.

Each of the resultant specimens was introduced into a single-chambered vacuum evaporation apparatus, wherein an ITO transparent and conductive film was formed on the specimen by means of a conventional vacuum evaporation technique under the conditions shown in Table 7. Thus, there were obtained a plurality of solar cells of the configuration shown in FIG. 7, which is a schematic cross-section view. In FIG. 7, reference numeral 701 indicates a substrate, reference numeral 702 indicates an n-type layer, reference numeral 703 indicates an i-type layer, reference numeral 704 indicates a p-type layer, and reference numeral 705 indicates an ITO transparent and conductive film.

Each of the resultant solar cells was evaluated with respect to photoelectric conversion efficiency by subjecting it to irradiation with AM 1.5 pseudosunlight with an intensity of 100 mW/cm$^2$. As a result, each of the solar cells was found to exhibit a good photoelectric conversion efficiency which is equivalent to that exhibited by the solar cell obtained using a three-chambered film-forming apparatus in which the three chambers are definitely isolated by the respective gas gates.

In addition, as for each of the solar cells obtained in the above, the impurity distribution in the thicknesswise direction was measured by means of a secondary ion mass spectrometer (SIMS). As a result, it was found that the i-type layer of each of the solar cells is contaminated neither with the P atoms contained in the n-type layer nor with the B atoms contained in the p-type layer. From this result, it was recognized that the respective film-forming raw material gases used in the adjacent film-forming chambers which are greatly different with respect to their inner pressure upon film formation are substantially completely separated by the gas gate.

Further in addition, as for the foregoing substrate web having the three amorphous silicon films stacked thereon taken out from the roll-to-roll apparatus, the surface state thereof was examined by a conventional manner. As a result, no wear was found. Similarly, as for each of the solar cells, examination was made of whether or not it is accompanied by defects due to wear. As a result, it was found that any of the solar cells is not accompanied by such defect.

Comparative Production Example 1

The procedures of Production Example 1 were repeated, except that each of the gas gates was replaced by a conventional gas gate in which the slit is entirely of 3 mm in slit height, to thereby obtain a plurality of pin junction solar cells.

Each of the resultant solar cells was evaluated with respect to photoelectric conversion efficiency in the same manner in the above example. As a result, their photoelectric conversion efficiency was found to be as low as many as 0.3 in terms of a relative value to the value of photoelectric conversion efficiency exhibited by the solar cell obtained in Production Example 1 which was set at a value of 1.

In addition, as for each of the solar cells obtained in the above, the impurity distribution in the thicknesswise direction was measured by means of the secondary ion mass spectrometer (SIMS). As a result, it was found that the i-type layer of each of the solar cells is contaminated with a detectable amount of the P atoms contained in the n-type layer and also with a detectable amount of the B atoms contained in the p-type layer. From this result, it was recognized that the respective film-forming raw material gases used in the adjacent film-forming chambers which are greatly different with respect to their inner pressure upon film formation are not sufficiently separated by the gas gate.

Separately, the above solar cell-producing procedures were repeated, except that each of the gas gates was replaced by a conventional gas gate in which the slit is entirely of 1.5 mm in slit height, to obtain a plurality of pin junction solar cells.

Each of the resultant solar cells was evaluated with respect to photoelectric conversion efficiency. As a result, their photoelectric conversion efficiency was found to be 0.95 in terms of a relative value to the value of photoelectric conversion efficiency exhibited by the solar cell obtained in Production Example 1 which was set at a value of 1.

In addition, as for the substrate web having the three amorphous silicon films stacked thereon taken out from the roll-to-roll apparatus, the surface state thereof was examined by a conventional manner and a result, wears were found. And some of the solar cells were found to be accompanied by defects due to those wears. These solar cells were continuously used over a long period of time, wherein 30% of the solar cells were short-circuited, and their photoelectric conversion efficiency were extremely low.

Production Example 2

There was continuously formed a pin/pin/pin type amorphous silicon solar cell on a substrate web using the fabrication apparatus shown in FIG. 2 according to the present invention.

From the substrate feed chamber 204 containing a reel having a lengthy stainless steel substrate web 107 having a mirror ground surface and of 30 cm in width, 100 m in length and 0.15 mm in thickness wound thereon, the substrate web was paid out, it was passed through the nine film-forming chambers 201, 202, 203, 208, 209, 210, 211, 212, and 213, and fixed to a take-up reel in the substrate take-up chamber 205. Herein, each of the gas gates disposed between each pair of the adjacent chambers was designed such that the slit has a region with a slit height of 6 mm and another region with a slit height of 3 mm, and has a length of 40 cm.

Preparation for film formation was made for each of the film-forming chambers. Then, $H_2$ gas as the separation gas was introduced into the slit of each of the gas gates from above and below directions through the gate gas feed pipe 207 at a flow rate of 200 sccm in total. Thereafter, film formation was started in each of the film-forming chambers under the film-forming conditions shown in Table 8, wherein three cells each comprising an n-type amorphous silicon film, an i-type amorphous silicon film and a p-type amorphous silicon film were continuously formed respectively by moving the substrate web through a first pin film-forming chamber group comprising the three film-forming chambers 201 to 203, a second pin film-forming chamber group comprising the three film-forming chambers 208 to 210 and a third pin film-forming chamber group comprising the three film-forming chambers 211 to 213. And the substrate web having the above films formed thereon was taken up by the reel in the substrate take-up chamber 205.

Figure 8:
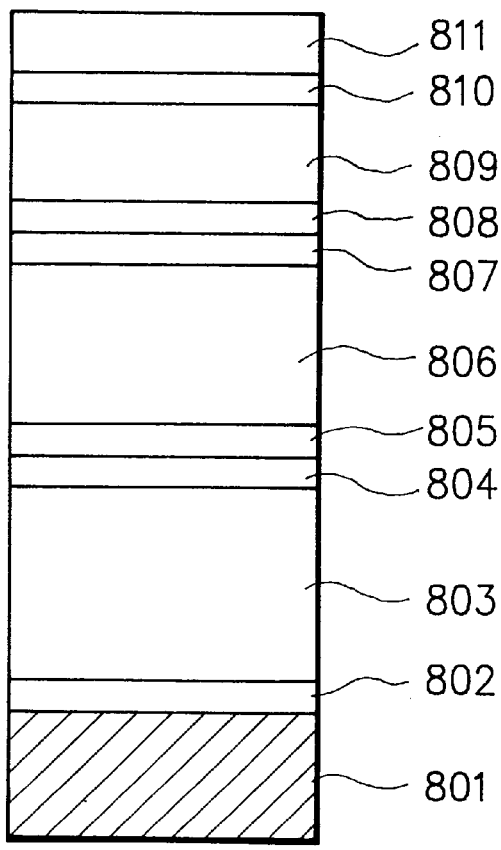
FIG. 8 is a schematic cross-section view illustrating the layer constitution of a solar cell produced in Production Example 2 of the present invention.

The substrate web having the nine amorphous silicon deposited films stacked thereon was taken out from the roll-to-roll apparatus. Then, there was formed an ITO transparent and conductive film in the same manner as in Production Example 1. The resultant was cut into pieces of 10 cm×10 cm in size to obtain a plurality of solar cells of the configuration shown in FIG. 8, which is a schematic cross-section view. In FIG. 8, reference numeral 801 indicates a substrate, each of reference numerals 802, 805, and 808 indicates an n-type layer, each of reference numerals 803, 806, and 809 indicates an i-type layer, each of reference numerals 804, 807, and 810 indicates a p-type layer, and reference numeral 811 indicates an ITO transparent and conductive film.

Each of the resultant solar cells was evaluated with respect to photoelectric conversion efficiency. As a result, each of the solar cells was found to exhibit a good photoelectric conversion efficiency which is equivalent to that exhibited by the solar cell obtained under the same film-forming conditions in the above using a nine-chambered film-forming apparatus in which the nine chambers are definitely isolated by the respective gas gates.

In addition, as for each of the solar cells obtained in the above, the impurity distribution in the thicknesswise direction was measured by means of the SIMS. As a result, it was found that the i-type layer of each of the solar cells is contaminated neither with the P atoms contained in the n-type layer nor with the B atoms contained in the p-type layer. From this result, it was recognized that the respective film-forming raw material gases used in the adjacent film-forming chambers which are greatly different with respect to their inner pressure upon film formation are substantially completely separated by the gas gate.

Further in addition, as for the foregoing substrate web having the nine deposited films stacked thereon taken out from the roll-to-roll apparatus, the surface state thereof was examined by a conventional manner. As a result, no wear was found. Similarly, as for each of the solar cells, examination was made of whether or not it is accompanied by defects due to wear. As a result, it was found that any of the solar cells is not accompanied by such defect.

Comparative Production Example 2

The procedures of Production Example 2 were repeated, except that each of the gas gates was replaced by a conventional gas gate in which the slit is entirely of 3 mm in slit height, to obtain a plurality of pin junction solar cells.

Each of the resultant solar cells was evaluated with respect to photoelectric conversion efficiency. As a result, their photoelectric conversion efficiency was found to be low as many as 0.2 in terms of a relative value to the value of photoelectric conversion efficiency exhibited by the solar cell obtained in Production Example 2 which was set at a value of 1.

In addition, as for each of the solar cells obtained in the above, the impurity distribution in the thicknesswise direction was measured by means of the secondary ion mass spectrometer (SIMS). As a result, it was found that the i-type layer of each of the solar cells is contaminated with a detectable amount of the P atoms contained in the n-type layer and also with a detectable amount of the B atoms contained in the p-type layer. From this result, it was recognized that the respective film-forming raw material gases used in the adjacent film-forming chambers which are greatly different with respect to their inner pressure upon film formation are not sufficiently separated by the gas gate.

Separately, the above solar cell-producing procedures were repeated, except that each of the gas gates was replaced by a conventional gas gate in which the slit is entirely of 1.5 mm in slit height, to obtain a plurality of pin junction solar cells.

Each of the resultant solar cells was evaluated with respect to photoelectric conversion efficiency. As a result, their photoelectric conversion efficiency was found to be 0.95 in terms of a relative value to the value of photoelectric conversion efficiency exhibited by the solar cell obtained in Production Example 2 which was set at a value of 1.

In addition, as for the substrate web having the nine deposited films stacked thereon taken out from the roll-to-roll apparatus, the surface state thereof was examined by a conventional manner and a result, wear was found. And some of the solar cells were found to be accompanied by defects due to such wear. These solar cells were continuously used over a long period of time, wherein 50% of the solar cells were short-circuited, and their photoelectric conversion efficiency were extremely low.

Production Example 3

The procedures of Production Example 1 were repeated, except that each of the gas gates was replaced by the roller type gas gate shown in FIG. 5, to thereby obtain a plurality of pin junction solar cells of the configuration shown in FIG.

7. Herein, each of the gas gates disposed between each pair of the adjacent chambers was designed such that the slit has a region with a slit height of 6 mm and another region with a slit height of 3 mm, and has a length of 40 cm.

Each of the resultant solar cells was evaluated with respect to photoelectric conversion efficiency. As a result, each of the solar cells was found to exhibit a good photoelectric conversion efficiency which is equivalent to that exhibited by the solar cell obtained using a three-chambered film-forming apparatus in which the three chambers are definitely isolated by the respective gas gates.

In addition, as for each of the solar cells obtained in the above, the impurity distribution in the thicknesswise direction was measured by means of the SIMS. As a result, it was found that the i-type layer of each of the solar cells is contaminated neither with the P atoms contained in the n-type layer nor with the B atoms contained in the p-type layer. From this result, it was recognized that the respective film-forming raw material gases used in the adjacent film-forming chambers which are greatly different with respect to their inner pressure upon film formation are substantially completely separated by the gas gate.

Further in addition, as for the foregoing substrate web having the three deposited films stacked thereon taken out from the roll-to-roll apparatus, the surface state thereof was examined by a conventional manner. As a result, no wear was found. Similarly, as for each of the solar cells, examination was made of whether or not it is accompanied by defects due to wear. As a result, it was found that any of the solar cells is not accompanied by such defect.

Comparative Production Example 3

The procedures of Production Example 3 were repeated, except that each of the gas gates was replaced by a conventional gas gate in which the slit is entirely of 3 mm in slit height, to thereby obtain a plurality of pin junction solar cells.

Each of the resultant solar cells was evaluated with respect to photoelectric conversion efficiency. As a result, their photoelectric conversion efficiency was found to be low as many as 0.3 in terms of a relative value to the value of photoelectric conversion efficiency exhibited by the solar cell obtained in Production Example 3 which was set at a value of 1.

In addition, as for each of the solar cells obtained in the above, the impurity distribution in the thicknesswise direction was measured by means of the secondary ion mass spectrometer (SIMS). As a result, it was found that the i-type layer of each of the solar cells is contaminated with a detectable amount of the P atoms contained in the n-type layer and also with a detectable amount of the B atoms contained in the p-type layer. From this result, it was recognized that the respective film-forming raw material gases used in the adjacent film-forming chambers which are greatly different with respect to their inner pressure upon film formation are not sufficiently separated by the gas gate.

Separately, the above solar cell-producing procedures were repeated, except that each of the gas gates was replaced by a conventional gas gate in which the slit is entirely of 1.5 mm in slit height, to thereby obtain a plurality of pin junction amorphous silicon solar cells.

Each of the resultant solar cells was evaluated with respect to photoelectric conversion efficiency. As a result, their photoelectric conversion efficiency was found to be 0.9 in terms of a relative value to the value of photoelectric conversion efficiency exhibited by the solar cell obtained in Production Example 3 which was set at a value of 1.

In addition, as for the substrate web having the three deposited films stacked thereon, the surface state thereof was examined by a conventional manner and as a result, certain wear was found. And some of the solar cells were found to be accompanied by defects due to such wear. These solar cells were continuously used over a long period of time, wherein 20% of the solar cells were short-circuited, and their photoelectric conversion efficiency were extremely low.

TABLE 1

| film-forming chamber | layer thickness (Å) | gas used and its flow rate (sccm) | | microwave power applied (W) | substrate temperature (°C.) |
|---|---|---|---|---|---|
| 901 | i-type amorphous silicon | $SiH_4$: | 600 | 1000 | 350 |
| 902 | p-type amorphous silicon | $SiH_4$: $H_2$: $BF_3/H_2$ (5%): | 150 1000 930 | 800 | 250 |

TABLE 2

| | | slit height (mm) | | inner pressure of the film-forming chamber (mTorr) | | the amount of impurity contaminated into the | |
|---|---|---|---|---|---|---|---|
| flow rate of the gas gate (sccm) | the kind of the gas gate used | film-forming chamber 901 side (i-type film-forming chamber side) | film-forming chamber 902 side (p-type film-forming chamber side) | film-forming chamber 901 (i-type film-forming chamber) | film-forming chamber 902 (P-type film-forming chamber) | film-forming chamber 901 (the amount of B contaminated into the i-type film) | gas separation performance |
| 200 | C (conventional) | 6 | 6 | 50 5 | 5 50 | less than detection limit ($\leq 1 \times 10^{-6}$) $3 \times 10^{-4}$ | ○ × |
| | | 3 | 3 | 50 5 | 5 50 | less than detection limit $5 \times 10^{-5}$ | ○ × |
| | A (narrowed film-forming chamber 901 side) | 3 | 6 | 50 5 | 5 50 | less than detection lmt. less than detection lmt. | ○ ○ |

TABLE 2-continued

| flow rate of the gas gate (sccm) | the kind of the gas gate used | slit height (mm) | | inner pressure of the film-forming chamber (mTorr) | | the amount of impurity contaminated into the film-forming chamber 901 (the amount of B contaminated into the i-type film) | gas separation performance |
|---|---|---|---|---|---|---|---|
| | | film-forming chamber 901 side (i-type film-forming chamber side) | film-forming chamber 902 side (p-type film-forming chamber side) | film-forming chamber 901 (i-type film-forming chamber) | film-forming chamber 902 (P-type film-forming chamber) | | |
| | B (narrowed film-forming chamber 902 side) | 6 | 3 | 50 5 | 5 50 | less than detection limit $1 \times 10^{-4}$ | ○ × | remarks:
○ . . . excellent gas separation performance
× . . . practically unacceptable gas separation performance

TABLE 3

| flow rate of the gas gate (sccm) | the kind of the gas gate used | slit height (mm) | | inner pressure of the film-forming chamber (mTorr) | | the amount of impurity contaminated into the film-forming chamber 901 (the amount of B contaminated into the i-type film) | gas separation performance |
|---|---|---|---|---|---|---|---|
| | | film-forming chamber 901 side (i-type film-forming chamber side) | film-forming chamber 902 side (p-type film-forming chamber side) | film-forming chamber 901 (i-type film-forming chamber) | film-forming chamber 902 (p-type film-forming chamber) | | |
| 500 | C (conventional) | 6 | 6 | 50 5 | 5 50 | less than detection limit ($\leq 1 \times 10^{-6}$) $1 \times 10^{-4}$ | ○ × |
| | | 3 | 3 | 50 5 | 5 50 | less than detection limit $3 \times 10^{-5}$ | ○ × |
| | A (narrowed film-forming chamber 901 side) | 3 | 6 | 50 5 | 5 50 | less than detection lmt. less than detection lmt. | ○ ○ |
| | B (narrowed film-forming chamber 902 side) | 6 | 3 | 50 5 | 5 50 | less than detection limit $7 \times 10^{-5}$ | ○ × | remarks:
○ . . . excellent gas separation performance
× . . . practically unacceptable gas separation performance

TABLE 4

| flow rate of the gas gate (sccm) | the kind of the gas gate used | slit height (mm) | | inner pressure of the film-forming chamber (mTorr) | | the amount of impurity contaminated into the film-forming chamber 901 (the amount of B contaminated into the i-type film) | gas separation performance |
|---|---|---|---|---|---|---|---|
| | | film-forming chamber 901 side (i-type film-forming chamber side) | film-forming chamber 902 side (p-type film-forming chamber side) | film-forming chamber 901 (i-type film-forming chamber) | film-forming chamber 902 (p-type film-forming chamber) | | |
| 200 | C (conventional) | 6 | 6 | 50 5 | 5 50 | less than detection limit ($\leq 1 \times 10^{-6}$) ($3 \times 10^{-4}$) | ○ × |
| | | 3 | 3 | 50 5 | 5 50 | less than detection limit $5 \times 10^{-5}$ | ○ × |
| | D (the slit height is varied at the position close to the p-type film-forming chamber) | 3~6 (varied at the position which is shifted by 10 cm toward the p-type film-forming chamber from the | 3 | 50 5 | 5 50 | less than detection lmt. less than detection lmt. | ○ ○ |

TABLE 4-continued

| | | slit height (mm) | | inner pressure of the film-forming chamber (mTorr) | | the amount of impurity contaminated into the | |
|---|---|---|---|---|---|---|---|
| flow rate of the gas gate (sccm) | the kind of the gas gate used | film-forming chamber 901 side (i-type film-forming chamber side) | film-forming chamber 902 side (p-type film-forming chamber side) | film-forming chamber 901 (i-type film-forming chamber) | film-forming chamber 902 (p-type film-forming chamber) | film-forming chamber 901 (the amount of B contaminated into the i-type film) | gas separation performance |
| | E (the slit height is varied at the position close to the i-type film-forming chamber) | 6 (position where the gate gas is introduced) | 3~6 (varied at the position which is shifted by 10 cm toward the p-type film-forming chamber from the position where the gate gas is introduced) | 50 5 | 5 50 | less than detection lmt. less than detection lmt. | ○ ○ |
| | F (the slit height is gradually widened toward the p-type film-forming chamber) | 3~6 (continuously varied) | 3 | 50 5 | 5 50 | less than detection lmt. less than detection lmt. | ○ ○ | remarks:
○ . . . excellent gas separation performance
× . . . practically unacceptable gas separation performance

TABLE 5

| | | slit height (mm) | | inner pressure of the film-forming chamber (mTorr) | | the amount of impurity contaminated into the | |
|---|---|---|---|---|---|---|---|
| flow rate of the gas gate (sccm) | the kind of the gas gate used | film-forming 901 chamber side (i-type film-forming chamber side) | film-forming 902 chamber side (p-type film-forming chamber side) | film-forming chamber 901 (i-type film-forming chamber) | film-forming chamber 902 (p-type film-forming chamber) | film-forming chamber 901 (the amount of B contaminated into the i-type film) | gas separation performance |
| 200 | C (conventional) | 6 | 6 | 50 5 | 5 50 | less than detection limit ($\leq 1 \times 10^{-6}$) $3 \times 10^{-4}$ | ○ × |
| | | 3 | 3 | 50 5 | 5 50 | less than detection limit $5 \times 10^{-5}$ | ○ × |
| | G | 3 | 6 | 50 5 | 5 50 | less than detection lmt. less than detection lmt. | ○ ○ | remarks:
○ . . . excellent gas separation performance
× . . . practically unacceptable gas separation performance

TABLE 6

| film-forming chamber | layer thickness (Å) | gas used and its flow rate (sccm) | inner pressure (mTorr) | power applied (W) | substrate temperature (° C.) | deposition rate (Å/s) |
|---|---|---|---|---|---|---|
| 101 | n-type amorphous silicon (200) | $SiH_4$: 100 $H_2$: 1000 $PH_3/H_2$ (5%): 20 | 50 | 800 | 300 | 20 |
| 102 | i-type amorphous silicon (3000) | $SiH_4$: 600 | 5 | 1000 | 350 | 100 |

TABLE 6-continued

| film-forming chamber | layer thickness (Å) | gas used and its flow rate (sccm) | inner pressure (mTorr) | power applied (W) | substrate temperature (° C.) | deposition rate (Å/s) |
|---|---|---|---|---|---|---|
| 103 | p-type amorphous silicon (100) | SiH$_4$: 150<br>H$_2$: 1000<br>BF$_3$/H$_2$ (5%): 30 | 50 | 800 | 250 | 20 |

TABLE 7

| evaporation source | evaporation atmosphere | substrate temperature (° C.) | deposition rate (Å/s) | film thickness (Å) |
|---|---|---|---|---|
| In—Sn (alloy) (50:50) | O$_2$: 3 × 10$^{-4}$ Torr | 180 | 1 | 700 |

TABLE 8

| film-forming chamber | layer thickness (Å) | gas used and its flow rate (sccm) | inner pressure (mTorr) | power applied (W) | substrate temperature (° C.) | deposition rate (Å/s) |
|---|---|---|---|---|---|---|
| 201 | n-type amorphous silicon (200) | SiH$_4$: 100<br>H$_2$: 1000<br>PH$_3$/H$_2$ (5%): 20 | 50 | 800 | 300 | 20 |
| 202 | i-type amorphous silicon germanium (3000) | Si$_2$H$_6$: 500<br>GeH$_4$: 100 | 5 | 1000 | 350 | 100 |
| 203 | p-type amorphous silicon (100) | SiH$_4$: 150<br>H$_2$: 1000<br>BF$_3$/H$_2$ (5%): 30 | 50 | 800 | 250 | 20 |
| 208 | n-type amorphous silicon (100) | SiH$_4$: 80<br>H$_2$: 900<br>PH$_3$/H$_2$ (5%): 16 | 50 | 700 | 250 | 20 |
| 209 | i-type amorphous silicon (1500) | SiH$_4$: 400 | 5 | 800 | 300 | 100 |
| 210 | p-type amorphous silicon (100) | SiH$_4$: 150<br>H$_2$: 1000<br>BF$_3$/H$_2$ (5%): 30 | 40 | 600 | 250 | 20 |
| 211 | n-type amorphous silicon (100) | SiH$_4$: 100<br>H$_2$: 1000<br>PH$_3$/H$_2$ (5%): 60 | 40 | 800 | 300 | 20 |
| 212 | i-type amorphous silicon (700) | SiH$_4$: 200 | 5 | 1000 | 350 | 100 |
| 213 | p-type amorphous silicon (100) | SiH$_4$: 150<br>H$_2$: 1000<br>BF$_3$/H$_2$ (5%): 90 | 40 | 800 | 250 | 20 |

We claim:

1. A continuous film-forming apparatus, comprising:
a plurality of reaction chambers each capable of forming a semiconductor film with a different chemical composition, said plurality of reaction chambers being arranged such that a substrate web on which a film is to be formed can be hermetically moved through each of said reaction chambers under vacuum conditions; and
gas gate means disposed at a central position between each pair of adjacent reaction chambers, each of said gas gate means is provided with a slit for communication between said adjacent reaction chambers, said slit is provided with a clearance which allows the substrate web to move therethrough, said slit is structured such that gate gas can be introduced into said gas gate means from above and beneath the substrate web which is moved through said clearance, and said slit having dimensions such that opposite sides proximate to the position where the gate gas is introduced have different heights in accordance with the inner pressure of each of said adjacent reaction chambers communicated with each other by said slit.

2. A continuous film-forming apparatus according to claim 1, wherein the slit has a portion with a minimum height of 0.5 to 10 mm.

3. A continuous film-forming apparatus according to claim 1, wherein the slit comprises a first portion having a relatively large height and a second portion having a relatively small height, wherein the height of said first portion is as much as 1.1 to 3 times the height of said second portion.

4. A continuous film-forming apparatus according to claim 1, wherein the slit has a continuously graded height.

5. A continuous film-forming apparatus suitable for continuously forming a semiconductor device such as a p-i-n junction photovoltaic device on a substrate web, said apparatus comprising:

a RF plasma CVD first reaction chamber capable of forming a p-type semiconductor;

a microwave plasma CVD second reaction chamber capable of forming an i-type semiconductor;

a RF plasma CVD third reaction chamber capable of forming an n-type semiconductor, said first, second and third reaction chambers being arranged such that the substrate web can be hermetically moved through each of said reaction chambers;

first gas gate means positioned at a central position between said first reaction chamber and said second reaction chamber, said first gas gate means being structured such that gate gas can be introduced into said first gas gate means from above and beneath the substrate web, said first gas gate means being provided with a slit divided into a side adjacent said first reaction chamber and a side adjacent said second reaction chamber, said slit having a greater height on the side adjacent said first reaction chamber than the side adjacent said second reaction chamber in the moving direction of the substrate web; and second gas gate means positioned at a central position between said second reaction chamber and said third reaction chamber, said second gas gate means being structured such that gate gas can be introduced into said second gas gate means from above and beneath the substrate web, said second gas gate means being provided with a slit divided into a side adjacent said second reaction chamber and a side adjacent said third reaction chamber, said slit having a greater height on the side adjacent said second reaction chamber than the side adjacent said third reaction chamber in the moving direction of the substrate web.

6. A continuous film-forming apparatus, comprising:

a plurality of reaction chambers each capable of forming a semiconductor film with a different chemical composition, said plurality of reaction chambers being arranged such that a substrate web on which a film is to be formed can be hermetically moved through each of said reaction chambers under a vacuum condition;

gas gate means disposed at a central position between each pair of adjacent reaction chambers, each of said gas gate means is provided with means for defining a slit for communication between said adjacent reaction chambers, with the slit being connected at a gas feed position to a first gas feed pipe for introducing gate gas into said gas gate means from above the substrate web and to a second gas feed pipe for introducing gate gas into said gas gate means from beneath the substrate web, and said slit defining means dividing the slit into two slit portions divided at the gas feed position, wherein in an area proximate to the gas feed position one of the slit portions has a different height from that of the other slit portion in the moving direction of the substrate web.

7. A continuous film-forming apparatus according to claim 6, wherein the slit has a portion with a minimum height of 0.5 to 10 mm.

8. A continuous film-forming apparatus according to claim 6, wherein one of the two slit portions has a height which is as much as 1.1 to 3 times the height of the other slit portion.

9. A continuous film-forming apparatus, comprising:

a plurality of reaction chambers each capable of forming a semiconductor film with a different chemical composition, said plurality of reaction chambers being arranged such that a substrate web on which a film is to be formed can be hermetically moved through each of said reaction chambers under a vacuum condition;

gas gate means disposed at a central position between each pair of adjacent reaction chambers, each of said gas gate means is provided with means for defining a slit for communication between said adjacent reaction chambers, with the slit being connected at a gas feed position to a first gas feed pipe for introducing gate gas into said gas gate means from above the substrate web and to a second gas feed pipe for introducing gate gas into said gas gate means from below the substrate web, and said slit defining means dividing the slit into two slit portions divided at the gas feed position, wherein one of the two slit portions has a continuously graded input.

10. A continuous film-forming apparatus according to claim 9, wherein the slit has a portion with a minimum height of 0.5 to 10 mm.

11. A continuous film-forming apparatus according to claim 9, wherein the slit portion having a continuously graded height has a height which is as much as 1.1 to 3 times the height of the other slit portion.

* * * * *

UNITED STATES PATENT AND TRADEMARK OFFICE
CERTIFICATE OF CORRECTION

PATENT NO. : 5,919,310

DATED : July 6, 1999

INVENTOR(S): FUJIOKA ET AL.

Page 1 of 5

It is certified that error appears in the above-identified patent and that said Letters Patent is hereby corrected as shown below:

In the Drawings:
SHEET 15, FIGURE 16:

Replace Fig. 16 with the following:

FIG. 16

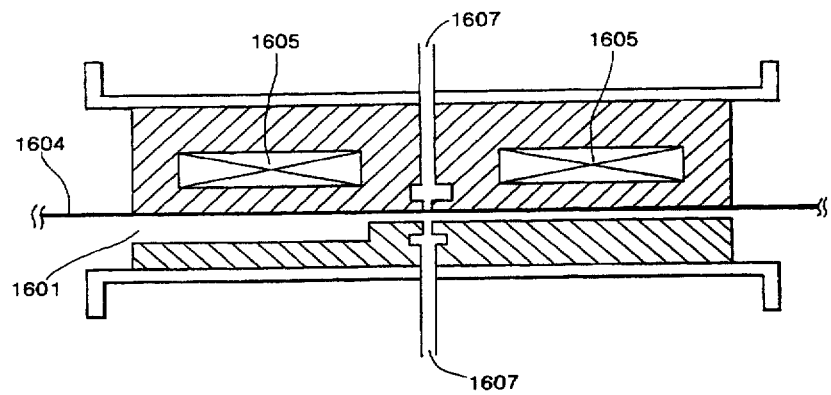

UNITED STATES PATENT AND TRADEMARK OFFICE
CERTIFICATE OF CORRECTION

PATENT NO. : 5,919,310

DATED : July 6, 1999

INVENTOR(S): FUJIOKA ET AL.

It is certified that error appears in the above-identified patent and that said Letters Patent is hereby corrected as shown below:

<u>SHEET 16, FIGURE 17</u>:

Replace Fig. 17 with the following:

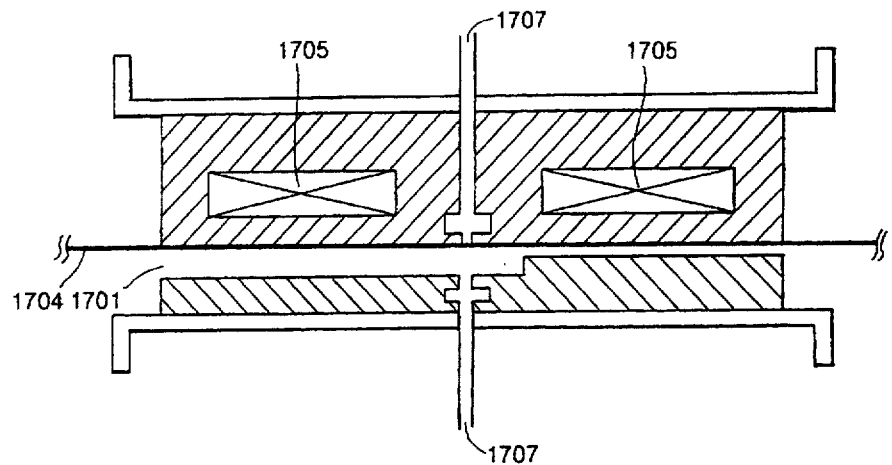

FIG. 17

UNITED STATES PATENT AND TRADEMARK OFFICE
CERTIFICATE OF CORRECTION

PATENT NO. : 5,919,310

DATED : July 6, 1999

INVENTOR(S): FUJIOKA ET AL.

Page 3 of 5

It is certified that error appears in the above-identified patent and that said Letters Patent is hereby corrected as shown below:

SHEET 17, FIGURE 18:

Replace Fig. 18 with the following:

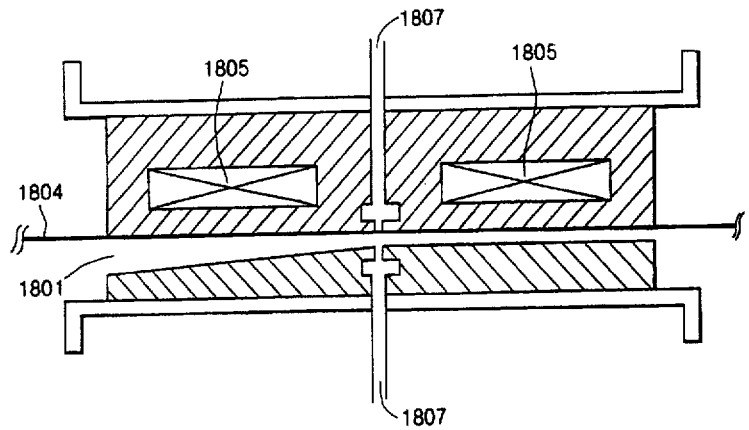

FIG. 18

UNITED STATES PATENT AND TRADEMARK OFFICE
CERTIFICATE OF CORRECTION

PATENT NO. : 5,919,310

DATED : July 6, 1999

INVENTOR(S): FUJIOKA ET AL.

It is certified that error appears in the above-identified patent and that said Letters Patent is hereby corrected as shown below:

SHEET 9, FIGURE 10:

Replace Fig. 10 with the following:

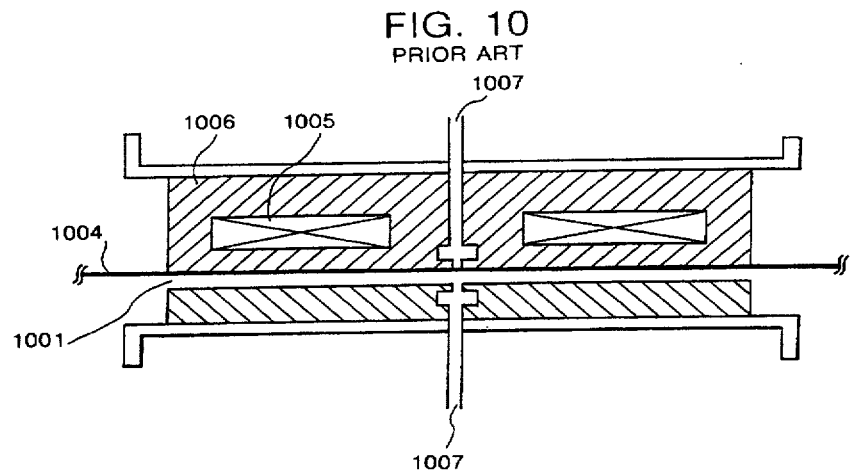

FIG. 10
PRIOR ART

UNITED STATES PATENT AND TRADEMARK OFFICE
CERTIFICATE OF CORRECTION

PATENT NO. : 5,919,310

DATED : July 6, 1999

INVENTOR(S): FUJIOKA ET AL.

It is certified that error appears in the above-identified patent and that said Letters Patent is hereby corrected as shown below:

[56] REFERENCES CITED:

FOREIGN PATENT DOCUMENTS, "330419  2/1991  Japan" should be deleted.

COLUMN 8:

Line 60, "904 or 904," should read --903 or 904,--.

Signed and Sealed this

Sixth Day of June, 2000

Attest:

Q. TODD DICKINSON

*Attesting Officer*   *Director of Patents and Trademarks*